United States Patent
Sugahara

(10) Patent No.: US 7,764,519 B2
(45) Date of Patent: Jul. 27, 2010

(54) CONTROL CIRCUIT AND METHOD FOR CONTROLLING SWITCHING POWER SUPPLY

(75) Inventor: Satoshi Sugahara, Matsumoto (JP)

(73) Assignee: Fuji Electric Systems Co., Ltd., Tokyo (JP)

(*) Notice: Subject to any disclaimer, the term of this patent is extended or adjusted under 35 U.S.C. 154(b) by 299 days.

(21) Appl. No.: 12/153,712

(22) Filed: May 22, 2008

(65) Prior Publication Data

US 2008/0298092 A1 Dec. 4, 2008

(30) Foreign Application Priority Data

May 28, 2007 (JP) ............... 2007-140957

(51) Int. Cl.
*H02M 3/335* (2006.01)
*H02M 1/12* (2006.01)

(52) U.S. Cl. ............... 363/21.12; 363/21.18; 363/41; 363/97; 363/21.01

(58) Field of Classification Search ............... 363/21.01, 363/21.12, 21.18, 41, 97
See application file for complete search history.

(56) References Cited

U.S. PATENT DOCUMENTS

| | | | | |
|---|---|---|---|---|
| 6,341,075 B2* | 1/2002 | Yasumura | ............... | 363/21.02 |
| 6,349,046 B2* | 2/2002 | Yasumura | ............... | 363/21.02 |
| 6,900,994 B2* | 5/2005 | Asayama | ............... | 363/21.01 |
| 7,158,392 B2* | 1/2007 | Hosokawa et al. | ....... | 363/21.06 |
| 7,236,376 B2* | 6/2007 | Yang | ............... | 363/21.04 |
| 7,446,431 B2* | 11/2008 | Chiu | ............... | 307/52 |
| 2007/0109821 A1* | 5/2007 | Yang | ............... | 363/21.04 |

FOREIGN PATENT DOCUMENTS

| | | |
|---|---|---|
| JP | 07-095769 | 4/1995 |
| JP | 10-323028 | 12/1998 |
| JP | 2002-261588 | 9/2002 |
| JP | 2003-319644 | 11/2003 |
| JP | 2004-282352 | 10/2004 |
| JP | 2005-143197 | 6/2005 |
| JP | 2006-121848 | 5/2006 |

* cited by examiner

*Primary Examiner*—Bao Q Vu
(74) *Attorney, Agent, or Firm*—Rabin & Berdo, P.C.

(57) ABSTRACT

Control circuit and method for controlling a switching power supply, which regulates its output voltage using pulse-width modulation (PWM) that switches on and off a main switch with a PWM signal (VCONT) at an adjusted ON-period ratio of the main switch. The control circuit includes an error signal amplifier circuit that compares the output voltage with a reference voltage and outputs an error signal VE based on the comparison. The control circuit also includes an ON-period adjusting circuit that starts generating a PWM signal (VCONT) in every cycle based on a pulse VPULSE, the period thereof being fixed, and adjusts the HIGH-period of the PWM signal (VCONT) based on the output voltage of the error signal VE. As a result, the control circuit widens the HIGH-period ratio range or the LOW-period ratio range of the PWM signal greatly.

16 Claims, 22 Drawing Sheets

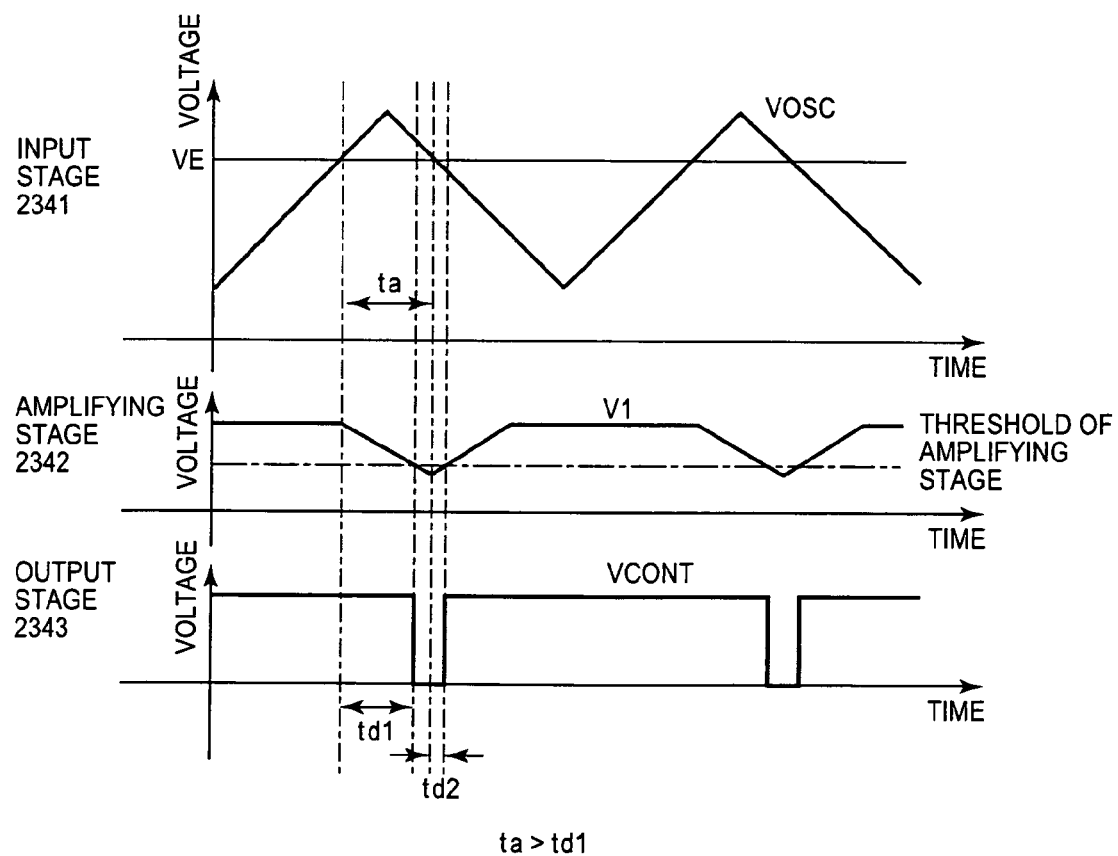

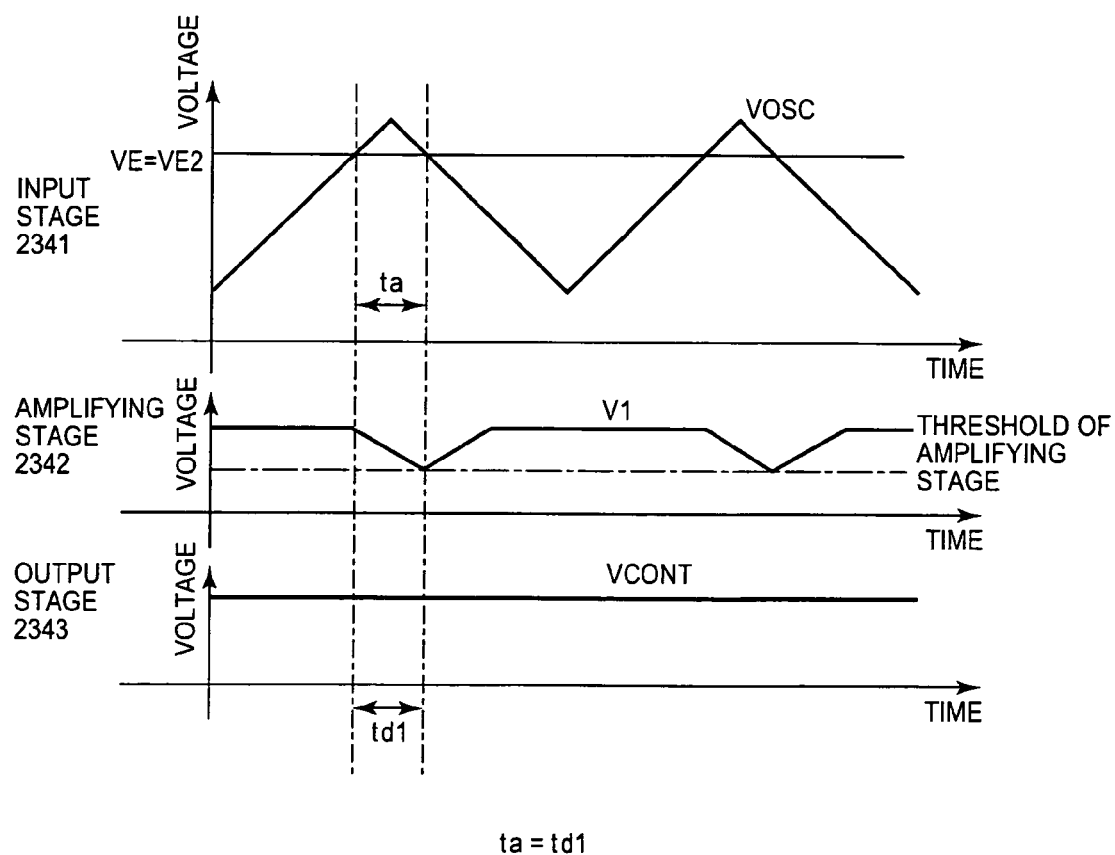

CONTROL CIRCUIT AND METHOD FOR CONTROLLING SWITCHING POWER SUPPLY

FIELD OF THE INVENTION

The present invention relates to a control circuit for controlling a switching power supply that regulates the output voltage therefrom by adjusting the ratio of the ON-period and the OFF-period of the switching device thereof by means of the pulse-width-modulation method (hereinafter referred to as the "PWM method"). The invention relates also to a method for controlling the switching power supply.

BACKGROUND OF THE INVENTION

FIG. 12 is a block diagram showing the general structure of a conventional switching power supply.

Various inverters and converters are used for the switching power supply. Hereinafter, the conventional switching power supply will be described in connection with a DC-DC converter as a typical example. In the conventional switching power supply shown in FIG. 12, the output voltage VOUT from DC-DC converter 100 is fed back to converter control section 200. Converter control section 200 compares the output voltage VOUT with a reference value, generates a PWM signal (VCONT) based on the comparison results and outputs the PWM signal (VCONT). DC-DC converter 100 switches on and off a semiconductor switch such as a MOSFET and a bipolar transistor or a mechanical switch such as a relay based on the PWM signal (VCONT) outputted to set the output voltage VOUT therefrom to be close to the reference value.

Concrete examples of the DC-DC converter in FIG. 12 are illustrated in FIGS. 13 through 20. FIG. 13 shows a first buck converter used as the DC-DC converter in FIG. 12. FIG. 14 shows a second buck converter used as the DC-DC converter in FIG. 12. FIG. 15 shows a first boost converter used as the DC-DC converter in FIG. 12. FIG. 16 shows a second boost converter used as the DC-DC converter in FIG. 12. FIG. 17 shows a first buck-boost converter used as the DC-DC converter in FIG. 12. FIG. 18 shows a second buck-boost converter used as the DC-DC converter in FIG. 12. FIG. 19 shows a first flyback converter used as the DC-DC converter in FIG. 12. FIG. 20 shows a second flyback converter used as the DC-DC converter in FIG. 12.

Now the conventional DC-DC converters will be described briefly below. The output voltage Vo (VOUT in FIG. 13) from the conventional buck converter shown in FIG. 13 is expressed as $Vo=Ton/(Ton+Toff) \times Vi$ using the ON-period (conducting period) Ton of main switch S1 (104), the OFF-period (non-conducting period) Toff thereof, and the input voltage Vi (VIN in FIG. 13). When the input voltage Vi varies, the DC-DC converter shown in FIG. 13 adjusts the ratio of the ON-period Ton and the OFF-period Toff of main switch S1 (104) to absorb the change caused in the input voltage Vi and to keep the output voltage Vo at a certain value. The term $Ton/(Ton+Toff)$ in the above-described equation is an ON-period ratio D. Using the ON-period ratio D, the above-described equation is given by $Vo=D \times Vi$. The above-described equation does not consider any loss. The above-described equation describes the operation of the DC-DC converter in the continuous mode, in which a current flows through coil 120 continuously. (In the following, the DC-DC converters will be described similarly in connection with the continuous operation mode thereof.) The conventional buck converter shown in FIG. 14 is a modification of the first buck converter shown in FIG. 13. In FIG. 14, subsidiary switch S2 (106) is disposed in substitution for flywheel diode D2 (107) shown in FIG. 13. Since the DC-DC converter shown in FIG. 14 works essentially in the same manner as the DC-DC converter shown in FIG. 13, the operation of the DC-DC converter shown in FIG. 14 is not described herein. Subsidiary switch S2 (106) is switched on and off oppositely to the switching on and off of main switch S1 (104).

The first boost converter shown in FIG. 15 is a DC-DC converter, the output voltage Vo therefrom is expressed by $Vo=((Ton+Toff)/Toff) \times Vi=(1/(1-D)) \times Vi$. The first boost converter shown in FIG. 15 superimposes the energy stored in coil 120 while main switch S1 (104) is conductive (during Ton) and the voltage Vo thereof is given by $((Ton+Toff)/Toff) \times Vi=(1/(1-D)) \times Vi$, onto the input energy, the voltage thereof is Vin, while main switch S1 (104) is switched off (during Toff). The conventional boost converter shown in FIG. 16 is a modification of the first boost converter shown in FIG. 15. In FIG. 16, subsidiary switch S2 (106) is disposed in substitution for flywheel diode D2 (107) shown in FIG. 15. Since the DC-DC converter shown in FIG. 16 works essentially in the same manner as the DC-DC converter shown in FIG. 15, the operation of the DC-DC converter shown in FIG. 16 is not described herein. Subsidiary switch S2 (106) is switched on and off oppositely to the switching on and off of main switch S1 (104).

The first buck-boost converter shown in FIG. 17 is a DC-DC converter, the output voltage Vo therefrom is expressed by $Vo=-Ton/Toff \times Vi=-(D/(1-D)) \times Vi$. The first buck-boost converter uses the energy stored in coil 120 while main switch S1 (104) is conductive (during Ton) for making a current flow through coil 120, while main switch S1 (104) is switched off (during Toff), to the direction same with the direction, to which a current flows through coil 120 while main switch S1 (104) is conductive (during Ton). The DC-DC converter shown in FIG. 17 facilitates setting the output voltage Vo not only to be higher than the input voltage Vi, but also to be lower than the input voltage Vi. The conventional buck-boost converter shown in FIG. 18 is a modification of the first buck-boost converter shown in FIG. 17. In FIG. 18, subsidiary switch S2 (106) is disposed in substitution for flywheel diode D2 (107) shown in FIG. 17. Since the DC-DC converter shown in FIG. 18 works essentially in the same manner as the DC-DC converter shown in FIG. 17, the operation of the DC-DC converter shown in FIG. 18 is not described herein. Subsidiary switch S2 (106) is switched on and off oppositely to the switching on and off of main switch S1 (104).

The first flyback converter shown in FIG. 19 is a DC-DC converter, the output voltage Vo therefrom is expressed by $Vo=(N2/N1) \times (Ton/Toff) \times Vi=(N2/N1) \times (D/(1-D)) \times Vi$. The first flyback converter stores an energy in transformer 125 through primary winding N1 thereof, while main switch S1 (104) is conductive (during Ton). As main switch S1 (104) is switched off (during Toff), the first flyback converter outputs the energy stored in transformer 125 to output capacitor 130 via secondary winding N2 in transformer 125. Herein, the winding ratio of transformer 125 is given by N2/N1. The conventional flyback converter shown in FIG. 20 is a modification of the first flyback converter shown in FIG. 19. In FIG. 20, subsidiary switch S2 (106) is disposed in substitution for flywheel diode D2 (107) shown in FIG. 19. Since the DC-DC converter shown in FIG. 20 works essentially in the same manner as the DC-DC converter shown in FIG. 19, the operation of the DC-DC converter shown in FIG. 20 is not described herein. Subsidiary switch S2 (106) is switched on and off oppositely to the switching on and off of main switch S1 (104).

The switches S1 and S2 in FIGS. 14, 16, 18 and 20 are switched on and off based on the PWM signal (VCONT) via driver circuit 102. While the switch S1 is ON (conductive), the subsidiary switch S2 is forced to be OFF (non-conductive). While the switch S1 is OFF (non-conductive), the subsidiary switch S2 is forced to be ON (conductive). In the switching power supply apparatuses shown in FIGS. 13 through 20, a discontinuous current mode is caused when the load is light. In the discontinuous current mode, both the main switch S1 and the diode D2 are not conductive or both the switches S1 and S2 are OFF. The switching power supply apparatuses shown in FIGS. 13 through 20 control the output voltage thereof by adjusting the ON-period ratio D even in the discontinuous current mode. (Detailed description on the discontinuous current mode is not made herein.)

Now the operation of converter control section 200 in FIG. 12 will be described more in detail below with reference to FIG. 21 that schematically describes the operation waveforms of conventional converter control section 200 and FIG. 22 that shows the structural example thereof.

Converter control section 200 in FIG. 12 includes detector circuit 210, reference voltage supply VREF (220), and control circuit 230. Control circuit 230 includes error amplifier circuit 232, comparator circuit 234 and oscillator circuit 236. Comparator circuit 234 outputs a PWM signal (VCONT). Oscillator circuit 236 can output a triangular wave, saw-tooth wave, sinusoidal wave and such various waves. Herein, the operation of converter control section 200 is described in connection with a widely-used triangular wave that oscillator circuit 236 outputs. Therefore, oscillator circuit 236 is a triangular-wave generator herein. The upper waveforms in FIG. 21 typically describe the comparison of an error voltage VE and a triangular wave VOSC. The lower waveform in FIG. 21 describes an output signal VCONT (PWM signal) generated based on the waveform comparison illustrated by the upper waveforms in FIG. 21. In FIG. 21, TS is the period of the output waveform VOSC from oscillator circuit 236 and equal to the period (switching period), for which main switch S1 (104) in the switching power supply is switched on and off. In FIG. 21, t1 is the ON-period (above-described Ton) of main switch S1 (104) and t2 is the OFF-period (above-described Toff) of main switch S1 (104). The ON-period ratio D of main switch S1 (104) is given by D=t1/TS. The period TS of the output waveform VOSC is given by the following formula.

$$TS = t1 + t2 = Ton + Toff$$

The converter control section shown in FIG. 22 employs detecting resistors R1 and R2 for detector circuit 210 and an operational amplifier (error amplifier in the figure) for error amplifier circuit 232. The converter control section shown in FIG. 22 also employs a triangular-wave generator for oscillator circuit 236 and a comparator (PWM comparator in the figure) for comparator circuit 234. Alternatively, detector circuit 210 is not employed and the output voltage VOUT is set to be equal to the voltage V0. Still alternatively, a reference value is applied from the outside in substitution for reference voltage supply VREF (220) and the applied reference value is changed with time. In the alternative cases, the comparator control section operates essentially in the same manner as in the case described at first in this paragraph. Therefore, the operation of conventional converter control section 200 will be described below in connection with the circuit configuration shown in FIG. 22.

FIG. 23A is a block functional diagram describing the signal processing process of comparator circuit (comparator) 234 in the conventional converter control section shown in FIG. 22. FIGS. 23B through 23D are wave charts describing the operation waveforms of comparator circuit (comparator) 234 in the conventional converter control section shown in FIG. 22.

Referring now to FIG. 23A, the contents of the signal processing conducted by comparator 234 may be divided generally into input stage 2341, amplifying stage 2342 and output stage 2343. Comparator 234 generates the output signal VCONT (PWM signal) in output stage 2343 based on the input waveforms blunted in input stage 2341 and amplifying stage 2342 and outputs the output signal VCONT (PWM signal).

The waveforms inputted to input stage 2341 are shown in the upper parts of FIGS. 23B through 23D. The waveforms inputted to amplifying stage 2342 are shown in the middle parts of these figures. The waveforms outputted from output stage 2343 are shown in the lower parts of these figures. Usually, the delay td1 is caused on the waveform outputted from output stage 2343 mainly by the blunting caused on the input voltage V1 inputted to amplifying stage 2342. Since the input voltage V1 inputted to amplifying stage 2342 changes greatly across the threshold of amplifying stage 2342 in the state shown in FIG. 23B, the output signal VCONT from output stage 2343 is generated in the form of pulses. More detailed explanations will be made below. In the state shown in FIG. 23B, the error signal VE outputted from error amplifier 232 is compared in PWM comparator 234 with the triangular wave VOSC outputted from triangular wave generator 236. When the error signal VE is equal to VE1 and VE1 is higher than VOSC, the output signal VCONT from PWM comparator 234 is HIGH. As the triangular wave VOSC rises such that VOSC is higher than VE1, the output signal VCONT shifts to the LOW-state after the response delay time td1 caused in the shifting to the LOW-state of PWM comparator 234 elapses. As the triangular wave VOSC lowers such that VE1 is higher than VOSC, the output signal VCONT shifts to the HIGH-state after the response delay time td2 caused in the shifting to the HIGH-state of PWM comparator 234 elapses. As described above, the output signal VCONT repeats shifting to the LOW-state and the HIGH-state alternately after the delay for the response delay times td1 and td2 necessary for the shifting (output signal shift).

In the state shown in FIG. 23C, the error signal VE and the triangular wave VOSC reverse the height relation thereof in input stage 2341 while the changing input voltage V1 inputted to amplifying stage 2342 is still close to (not departing far from) the threshold of amplifying stage 2342. Therefore, the LOW-period of the output signal VCONT from output stage 2343 becomes short. More detailed explanations will be made below. When the error signal VE is higher than VE1 shown in FIG. 23B but slightly lower than VE2 shown in FIG. 23D in the state shown in FIG. 23C, the output signal VCONT shifts to the LOW-state after the response delay time td1 caused in the shifting to the LOW-state in PWM comparator 234 elapses. However, the error signal VE and the triangular wave VOSC reverse the height relation thereof in input stage 2341 soon. Therefore, the output signal VCONT shifts to HIGH-state after a short response delay time td2 caused in the shifting to the HIGH-state in PWM comparator 234 elapses. Therefore, the LOW-period of the output signal VCONT becomes short.

In the state shown in FIG. 23D, the error signal VE and the triangular wave VOSC reverse the height relation thereof in input stage 2341 before the lowering input voltage V1 reaches the threshold of amplifying stage 2342. Therefore, the input voltage V1 rises before reaching the threshold of amplifying stage 2342 and the output signal VCONT keeps the HIGH-state thereof without shifting to the LOW-state. More detailed explanations will be made below. In the state shown in FIG. 23D, the error signal VE becomes higher than the state thereof shown in FIG. 23C and equal to VE2. In other words, as the time ta in FIG. 23D becomes almost equal to the response delay time td1 caused in the shifting to the LOW-state in PWM comparator 234, PWM comparator 234 cannot respond, setting the output signal VCONT always to be HIGH. In the state in which PWM comparator 234 cannot respond, it is implied that the response delay time td2 caused in the shifting to the HIGH-state in PWM comparator 234 is shortened rapidly, causing zero delay time td2 finally.

In the above, the description is made in connection with the case, in which the error signal VE rises gradually. However, as the error signal VE lowers gradually and the time TS-ta becomes almost equal to the response delay time td2 caused in the shifting to the HIGH-state in PWM comparator 234, PWM comparator. 234 cannot respond, setting the output signal VCONT always at the LOW-state. In the state in which PWM comparator 234 cannot respond, it is implied that the response delay time td1 caused in the shifting to the LOW-state in PWM comparator 234 is shortened rapidly, causing zero delay time td1 finally.

FIG. 24 is a graph relating the ON-period ratio D in the conventional converter control section shown in FIG. 22 with the error signal VE.

As shown in FIG. 24, the conventional converter control section cannot output any pulse in the ON-period ratio range D smaller than td2/TS or higher than (TS−td1)/TS. (Here, td1 and td2 are the td1 and td2 shown in FIG. 23B.) In the D ranges described above, a region, in which any pulse with the pertinent ON-period ratio D is not generated suddenly, is caused as described above. Due to this, the span, for which the ON-period ratio D changes linearly, is narrowed.

The response delay caused by the PWM comparator used in the conventional converter control section is from several tens ns to several hundreds ns, generally. To meet the recent demands for down-sizing the switching power supply apparatuses, the switching frequency has been increased. Especially, the switching frequency of some DC-DC converters reaches several MHz. If the response delay of the PWM comparator is 100 ns, the ON-period ratio D controllable by the conventional converter control section will be 10 to 90%, when the switching frequency is 1 MHz. If the switching frequency is 10 MHz, the response time of the PWM comparator will be equal to the switching period, making it impossible to conduct switching any more. Therefore, the conventional converter control section prevents the switching power supply from increasing the switching frequency thereof.

For increasing the switching frequency of the switching power supply, Unexamined Japanese Patent Application Publication No. 2002-261588 and Unexamined Japanese Patent Application Publication No. 2004-282352 disclose circuits for generating a triangular wave or a saw-tooth wave causing neither overshooting nor undershooting at high frequencies. Since the disclosed circuits generate a triangular wave or a saw-tooth wave stably at high frequencies, the disclosed circuits provide techniques for precisely controlling the ON-period ratio or the OFF-period ratio using the triangular wave or the saw-tooth wave. The following Unexamined Japanese Patent Application Publication No. 2005-143197 discloses a DC-DC converter that facilitates obviating the problems caused by narrow-width-pulse propagation in generating a signal for determining the maximum ON-period ratio or the maximum OFF-period ratio and controlling the maximum ON-period ratio or the maximum OFF-period ratio very precisely even at a high frequency.

As described above, it is impossible to control the ON-period ratio precisely due to the response delay of the PWM comparator when the ON-period ratio is very large or very small. The three above-mentioned Japanese Patent documents do not describe anything on the above-described problem nor disclose any countermeasures for solving the above-described problem.

In view of the foregoing, it would be desirable to provide a control circuit and a control method for controlling a switching power supply that facilitate greatly widening the HIGH-period ratio range or the LOW-period ratio range of the PMW signal in regulating the output from the switching power supply by adjusting the ON-period ratio or the OFF-period ratio of the switching device in the switching power supply by the PWM method.

SUMMARY OF THE INVENTION

For obviating the problems described above, the control circuit according to the invention for controlling a switching power supply, which switches a switching device therein on and off with a PWM signal at an adjusted ON-period ratio for regulating the output voltage therefrom by a PWM method, includes:

an error amplifier circuit that can be configured to compare the output voltage from the switching power supply with a reference voltage for outputting an error signal;

a pulse generator circuit that can be configured to generate a pulse, the period thereof is fixed; and an ON-period adjusting circuit that can be configured to start generating the PWM signal in every cycle in response to the pulse outputted from the pulse generator circuit and adjust the ON-period (for which the PWM signal sets the switching device to be ON); wherein the ON-period adjusting circuit can change the ON-period in response to the output voltage of the error signal outputted from the error amplifier circuit for outputting a desired PWM signal.

The control circuit for controlling a switching power supply according to the invention facilitates greatly widening the HIGH-period ratio range or the LOW-period ratio range of the PMW signal in regulating the output from the switching power supply by adjusting the ON-period ratio or the OFF-period ratio of the switching device in the switching power supply by the PWM method.

BRIEF DESCRIPTION OF THE DRAWINGS

FIG. 23C shows waveforms illustrating the second operation waveforms of the comparator in the conventional converter control section.

FIG. 23D shows waveforms illustrating the third operation waveforms of the comparator in the conventional converter control section.

DETAILED DESCRIPTION

Now the modes for carrying out the present invention will be described in detail hereinafter with reference to the attached drawing figures.

Figure 1:
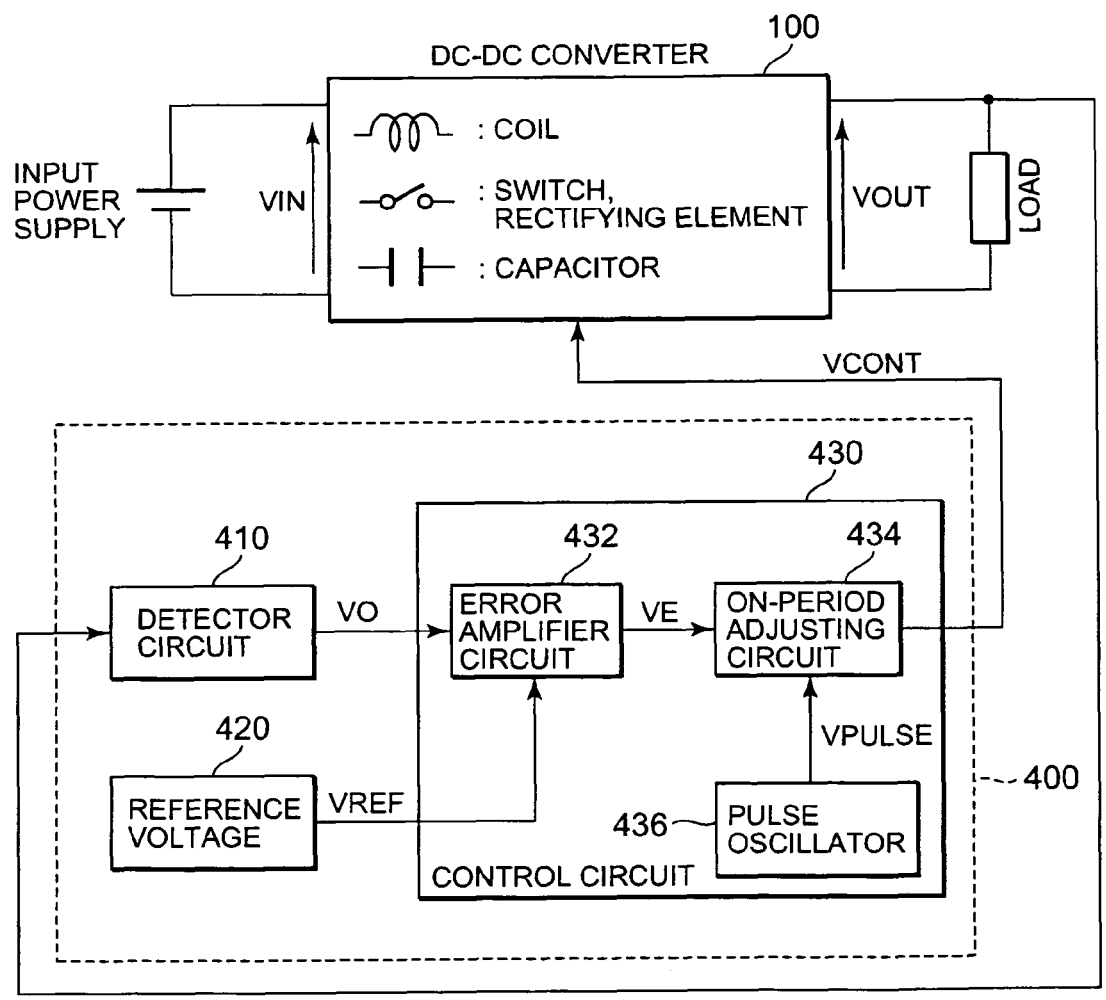
FIG. 1 is a block diagram of a switching power supply including a control circuit according to a first mode for carrying out the present invention.

FIG. 1 is a block diagram of a switching power supply including a control circuit according to a first mode for carrying out the invention.

Various inverters and converters are used for the switching power supply. Hereinafter, the switching power supply according to the invention will be described in connection with a DC-DC converter as a typical example.

Control circuit 430 according to the first mode for carrying out the invention includes error amplifier circuit 432, ON-period adjusting circuit 434, and pulse oscillator 436. Error amplifier circuit 432 compares a voltage VO, obtained by detecting the output voltage VOUT from DC-DC converter 100 with detector circuit 410, with a reference voltage VREF and outputs an error signal VE. Pulse oscillator 436 generates pulses shaped, for example, with a rectangular wave having a certain period. ON-period adjusting circuit 434 outputs a PWM signal (VCONT) to control the ON and OFF of the main switch in DC-DC converter 100. In controlling the ON and OFF of the main switch, ON-period adjusting circuit 434 starts generating a PWM signal in each period based on the pulse outputted from pulse oscillator 436. ON-period adjusting circuit 434 adjusts the ON-period, for which the PWM signal sets the switching device to be ON.

Control circuit 430 constitutes converter control section 400 in cooperation with detector circuit 410 and reference voltage supply 420. In the switching power supply shown in FIG. 1, the output voltage VOUT from DC-DC converter 100 is fed back to converter control section 400. Converter control section 400 compares the output voltage VOUT with a reference value, generates a PWM signal (VCONT) based on the comparison results and outputs the PWM signal (VCONT). A semiconductor switch such as a MOSFET and a bipolar transistor or a mechanical switch such as a relay circuit is switched on and off based on the outputted PWM signal (VCONT) to set the output voltage VOUT to be close to the reference value.

Figure 2A:
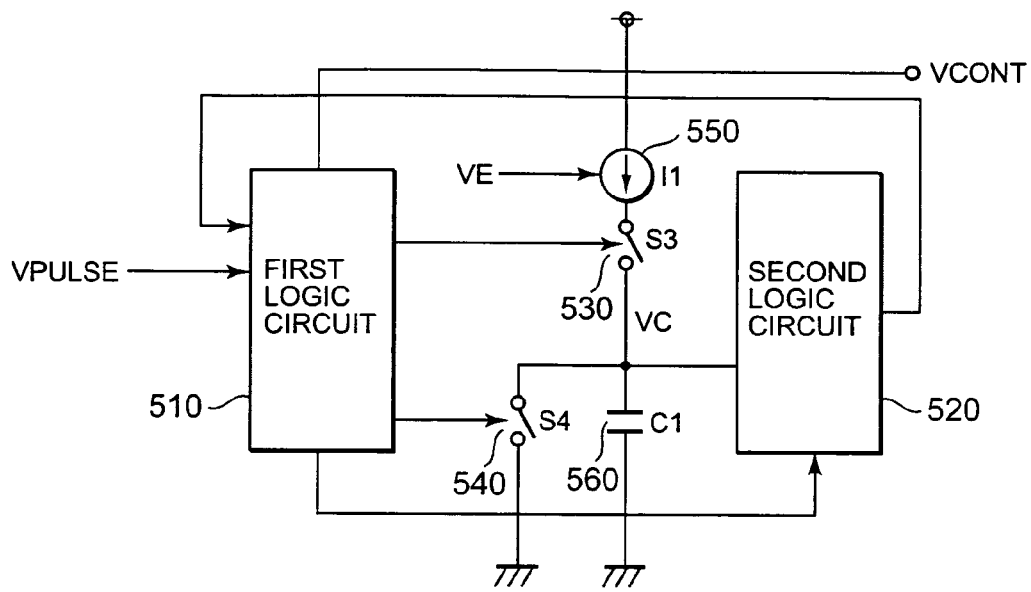
FIG. 2A is a block diagram of a first example for realizing the ON-period adjusting circuit shown in FIG. 1.

FIG. 2A is a block diagram of a first example for realizing the ON-period adjusting circuit 434 shown in FIG. 1.

ON-period adjusting circuit 434 includes first logic circuit 510, second logic circuit 520, switch S3 (530), switch S4 (540), voltage-controlled current source I1 (550) controlled by an error signal VE, and capacitor C1 (560). The output VPULSE from pulse oscillator 436 (cf. FIG. 1) and the output from second logic circuit 520 are inputted to first logic circuit 510. First logic circuit 510 feeds various outputs to second logic circuit 520, switch S3 (530) and switch S4 (540). First logic circuit 510 also outputs the PWM signal (VCONT), which is the output from converter control section 400 (cf. FIG. 1).

Switch S3 (530) becomes ON (conductive) when the output from first logic circuit 510 is HIGH to electrify capacitor C1 (560) with the current I1 from voltage-controlled current source I1 (550) controlled by the error signal VE. When the inverted signal of the output signal fed from first logic circuit 510 to switch S3 (530) is fed to switch S4 (540) and the output signal to switch S3 (530) is LOW (that is, when the signal fed to switch S4 (540) is HIGH), switch S4 (540) is switched on (becomes conductive), setting the VC terminal at 0 V. Second logic circuit 520 controls the output therefrom with relation to the VC terminal potential and the set threshold and receives the signal outputted from first logic circuit 510 and delayed for a certain period.

The differential coefficient of the trans-conductance of voltage-controlled current source I1 (550) is negative. The current fed from voltage-controlled current source I1 (550) becomes smaller as the error signal VE becomes larger. In other words, the electrifying time (integral time) of capacitor C1 (560) becomes longer as the output voltage VOUT is smaller and farther from the reference value thereof.

Figure 2B:
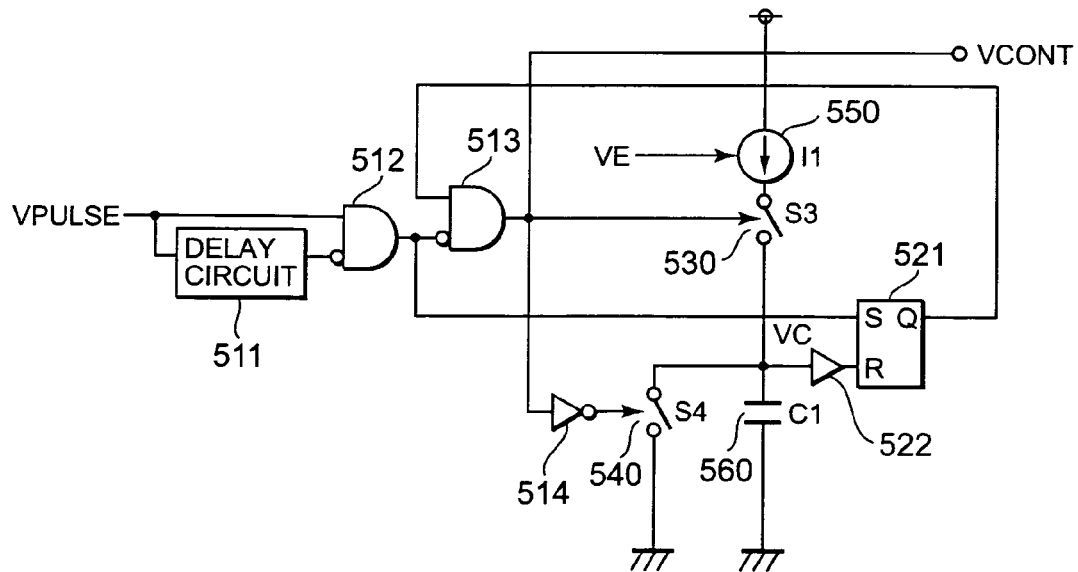
FIG. 2B is a block circuit diagram showing a concrete example for realizing the ON-period adjusting circuit shown in FIG. 2A.

FIG. 2B is a block circuit diagram showing a concrete example for realizing the ON-period adjusting circuit shown in FIG. 2A.

First logic circuit 510 shown in FIG. 2A is formed of tdr delay circuit 511, first AND circuit 512, second AND circuit 513 and inverter 514 in FIG. 2B. Second logic circuit 520 shown in FIG. 2A is formed of set-reset (RS) flip-flop circuit (hereinafter referred to as "RSFF") 521 and buffer 522. First AND circuit 512 receives the output VPULSE from pulse oscillator 436 as a first input. First AND circuit 512 inverts the delayed output VPLUSE delayed by tdr delay circuit 511 and receives the delayed output VPLUSE inverted as a second input. First AND circuit 512 feeds the output thereof to the set (S) terminal of RSFF 521 in second logic circuit 520. Thus, first logic circuit 510 transmits the signal delayed for a predetermined period (tdr) to second logic circuit 520.

First AND circuit 512 feeds the output thereof to a first input terminal of second AND circuit 513. The inverted output of first AND circuit 512 and the Q output from RSFF 521 in second logic circuit 520 are inputted to second AND circuit 513. The output from second AND circuit 513 is used for the output signal VCONT (PWM signal) and for controlling the switching on and off of switch S3 (530) and switch S4 (540).

RSFF 521 in second logic circuit 520 outputs from the Q output terminal thereof a HIGH signal or a LOW signal depending on the input logic conditions at the set (S) terminal and the reset (R) terminal thereof. Buffer 522 is disposed in the front stage of the R terminal of RSFF 521 for adjusting the threshold at the VC terminal. Buffer 522 may be formed of two stages of inverters not shown. For directly adjusting the threshold at the R (reset) terminal of RSFF 521, it is not necessary to dispose buffer 522.

Figure 3A:
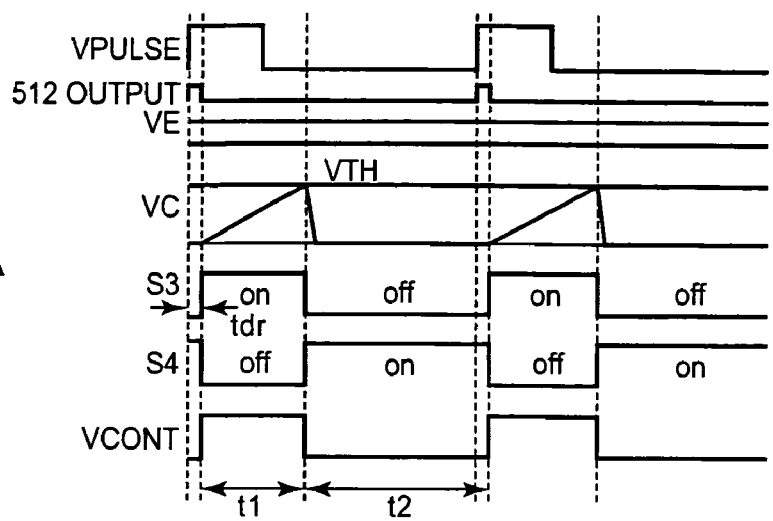
FIG. 3(a) shows waveforms illustrating the operation of the ON-period adjusting circuit shown in FIGS. 2(A) and 2(B) when the ON-period ratio is an intermediate one.
Figure 3B:
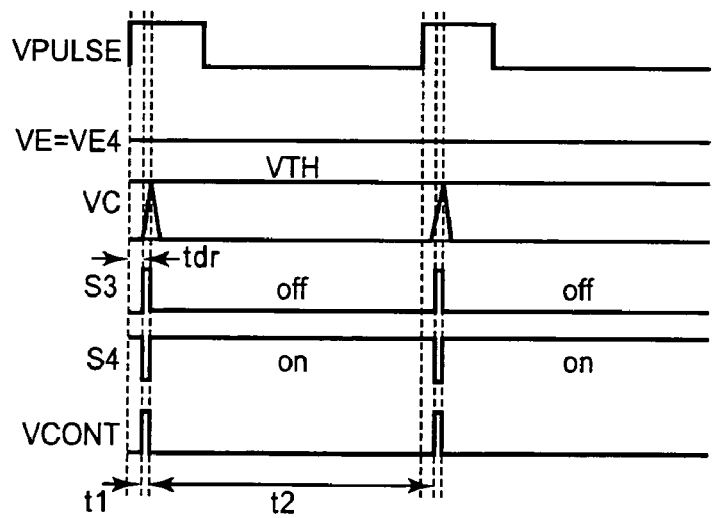
FIG. 3(b) shows waveforms illustrating the operation of the ON-period adjusting circuit shown in FIGS. 2(A) and 2(B) when the ON-period ratio is the minimum one.
Figure 3C:
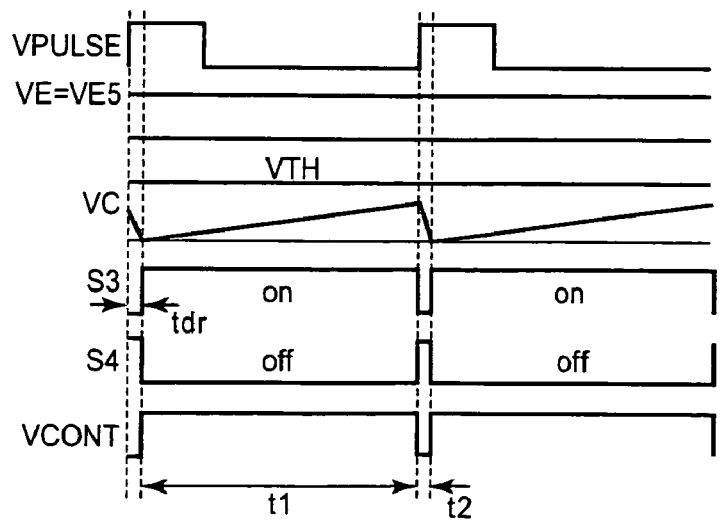
FIG. 3(c) shows waveforms illustrating the operation of the ON-period adjusting circuit shown in FIGS. 2(A) and 2(B) when the ON-period ratio is the maximum one.

FIG. 3(a) shows waveforms illustrating the operation of the ON-period adjusting circuit shown in FIGS. 2(A) and 2(B) when the ON-period ratio is an intermediate one. FIG. 3(b) shows waveforms illustrating the operation of the ON-period adjusting circuit shown in FIGS. 2(A) and 2(B) when the ON-period ratio is the minimum one. FIG. 3(c) shows waveforms illustrating the operation of the ON-period adjusting circuit shown in FIGS. 2(A) and 2(B) when the ON-period ratio is the maximum one.

First, the operation of the ON-period adjusting circuit shown in FIGS. 2(A) and 2(B) conducted with an intermediate ON-period ratio is described with reference to FIG. 3(a). A short while after the output VPULSE from pulse oscillator 436 (cf. FIG. 1) becomes LOW, switch S3 (530) is caused to be OFF and switch S4 (540) to be ON by first logic circuit 510 to set the VC terminal at 0 V. The Q output from RSFF 521 is LOW. The PWM signal (VCONT) outputted from second AND circuit 513 in first logic circuit 510 is set at the LOW level.

Then, as the output VPULSE becomes HIGH, a signal continuously HIGH for the delay time tdr is outputted from first AND circuit 512, setting RSFF 521. As a result, the Q output from RSFF 521 becomes HIGH. The output from second AND circuit 513 remains LOW until the output from first AND circuit 512 becomes LOW, since the AND condition for the inputs to second AND circuit 513 does not hold. Therefore, first logic circuit 510 delays to switch on switch S3 (530) and to switch off switch S4 (540) for the delay time tdr set by tdr delay circuit 511 from the time point, at which the output VPULSE becomes HIGH. Then, first logic circuit 510 switches on switch S3 (530) and off switch S4 (540) to electrify capacitor C1 (560) with the current I1 determined by the error signal VE. As capacitor C1 (560) is electrified, the VC terminal potential starts rising. The PWM signal (VCONT), that is the output from second AND circuit 513, is set to be HIGH.

As the VC terminal potential reaches the threshold voltage VTH of the input to second logic circuit 520, the reset (R) input to RSFF 521 in second logic circuit 520 works, setting the Q output from RSFF 521 to be LOW. (Here, the threshold voltage VTH of the input to second logic circuit 520 is the threshold of buffer 522 or the R terminal threshold of RSFF 521.) As a result, the PWM signal (VCONT), that is the output from second AND circuit 513, is set to be LOW and first logic circuit 510 switches off switch S3 (530) and on switch S4 (540) to set the CV terminal again at 0 V. By repeating the operations described above, the PWM signal (VCONT) is generated from the output of first logic circuit 510 (more in detail, from the output of second AND circuit 513).

Next, the operation of the ON-period adjusting circuit shown in FIGS. 2(A) and 2(B) conducted with the minimum ON-period ratio is described with reference to FIG. 3(b). As switch S3 (530) is switched on and switch S4 (540) is switched off while the error signal VE is low and voltage-controlled current source I1 (550) is outputting the current I1 at the set maximum value thereof, the VC terminal potential rises instantaneously. As the rising VC terminal potential reaches the threshold voltage VHT of the input to second logic circuit 520, the output from second logic circuit 520 shifts from the HIGH-state to the LOW-state. Therefore, PWM signal (VCONT), that is the output from first logic circuit 510 (more in detail, the output from second AND circuit 513), is shifted from the HIGH-state to the LOW-state.

If the response delay of the logic circuits and the switches is ignored, the HIGH-period t1 of the PWM signal (VCONT) will be the period, for which the VC terminal voltage rises from 0 V to the threshold voltage VHT of the input to second logic circuit 520. The HIGH-period t1 of the PWM signal (VCONT) is given by the following formula.

$$t1 = C1 \times VTH / I1$$

If it is assumed that the threshold voltage VHT of the input to second logic circuit 520 realized easily by the general complementary metal oxide semiconductor integrated circuit (hereinafter referred to as the "CMOS IC") is several V, the capacity C1 of capacitor C1 (560) is several pF, and the maximum value of the current I1 from voltage-controlled current source I1 (550) is several mA, the HIGH-period t1 of the PWM signal (VCONT) will be several ns. When the switching frequency is 1 MHz, the ON-period ratio D is 1% or smaller.

Now the operation of the ON-period adjusting circuit shown in FIGS. 2(A) and 2(B) conducted with the maximum ON-period ratio is described with reference to FIG. 3(c).

After switch S3 (530) shifts to the ON-state and switch S4 (540) to the OFF-state while the error signal VE is high and voltage-controlled current source I1 (550) is outputting the current I1 at the set minimum value thereof, the output from second logic circuit 520 is in the HIGH-state. The output from second logic circuit 520, that is the Q output from RSFF 521, keeps the HIGH-state thereof until the output VPULSE from pulse oscillator 436 (cf. FIG. 1) rises again from the LOW-state to the HIGH-state. Therefore, the PWM signal (VCONT), that is the output from first logic circuit 510 (that is, the output from second AND circuit 513), remains in the HIGH-state thereof. Then, the output from first logic circuit 510, that is the output from second AND circuit 513, is set at the LOW-state for the period tdr. In other words, the PWM signal (VCONT) is set at the LOW-state for the period tdr.

The period tdr is set for resetting the VC terminal potential at 0 V in the early stage of the next cycle, when the VC terminal potential fails to reach the threshold voltage VTH of the input to second logic circuit 520 before the output VPULSE from pulse oscillator 436 (cf. FIG. 1) rises again from the LOW-state to the HIGH-state after switch S3 (530) shifts to the ON-state and switch S4 (540) to the OFF-state. If the response delay of the logic circuits and the switches is ignored, the LOW-period t2 of the PWN signal (VCONT) will be equal to the period tdr. The period tdr is set based on the period necessary for discharging the electric charges stored in capacitor C1 (560) via switch S4 (540). If it is assumed that the capacity C1 of capacitor C1 (560) is several pF and the ON-state resistance of switch S4 (540) is several hundreds Ω, which are realized easily by the general CMOS IC, the time constant will be several ns. Therefore, the period tdr, that is equal to t2, can be set at several ns. If the switching frequency is 1 MHz, the ON-period ratio D will be 99% or more.

Figure 4A:
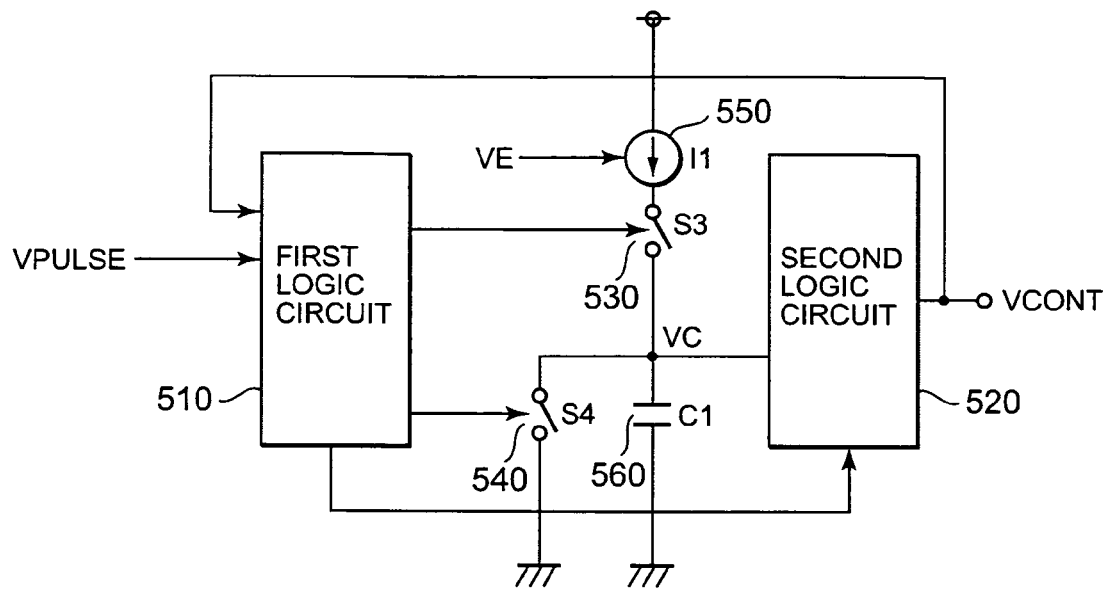
FIG. 4A is a block diagram of a first modified example of the ON-period adjusting circuit shown in FIG. 2A.

FIG. 4A is a block diagram of a first modified example of the ON-period adjusting circuit shown in FIG. 2A.

The ON-period adjusting circuit shown in FIG. 4A includes, in the same manner as the ON-period adjusting circuit shown in FIG. 2A, first logic circuit 510, second logic circuit 520, switch S3 (530), switch S4 (540), voltage-controlled current source I1 (550) controlled by an error signal VE, and capacitor C1 (560). The ON-period adjusting circuit in FIG. 2A is configured such that the output signal VCONT is outputted in the LOW-state during the period tdr. In contrast, the ON-period adjusting circuit in FIG. 4A is configured such that the output signal VCONT is outputted in the HIGH-state during the period tdr. The ON-period adjusting circuit in FIG. 4A is different from the ON-period adjusting circuit in FIG. 2A also in that the PWM signal (VCONT) is obtained from the output of second logic circuit 520 in the ON-period adjusting circuit in FIG. 4A.

The output VPULSE from pulse oscillator 436 (cf. FIG. 1) and the output from second logic circuit 520 are inputted to first logic circuit 510. First logic circuit 510 feeds various outputs to second logic circuit 520, switch S3 (530) and switch S4 (540). Switch S3 (530) is switched on (becomes conductive) in response to the HIGH output from first logic circuit 510 to electrify capacitor C1 (560) with the current I1 from voltage-controlled current source I1 (550) controlled by an error signal VE. When the inverted signal of the output signal fed from first logic circuit 510 to switch S3 (530) is fed to switch S4 (540) and the output signal to switch S3 (530) is LOW (that is, when the signal fed to switch S4 (540) is HIGH), switch S4 (540) is switched on (becomes conductive), setting the VC terminal at 0 V.

Second logic circuit 520 controls the output therefrom with relation to the VC terminal potential and the set threshold and receives the signal outputted from first logic circuit 510 and delayed for a certain period. The differential coefficient of the trans-conductance of voltage-controlled current source I1 (550) is negative. The current fed from voltage-controlled current source I1 (550) becomes smaller as the error signal VE becomes larger. In other words, the electrifying time (integral time) of capacitor C1 (560) becomes longer as the output voltage VOUT is smaller and farther from the reference value thereof.

Figure 4B:
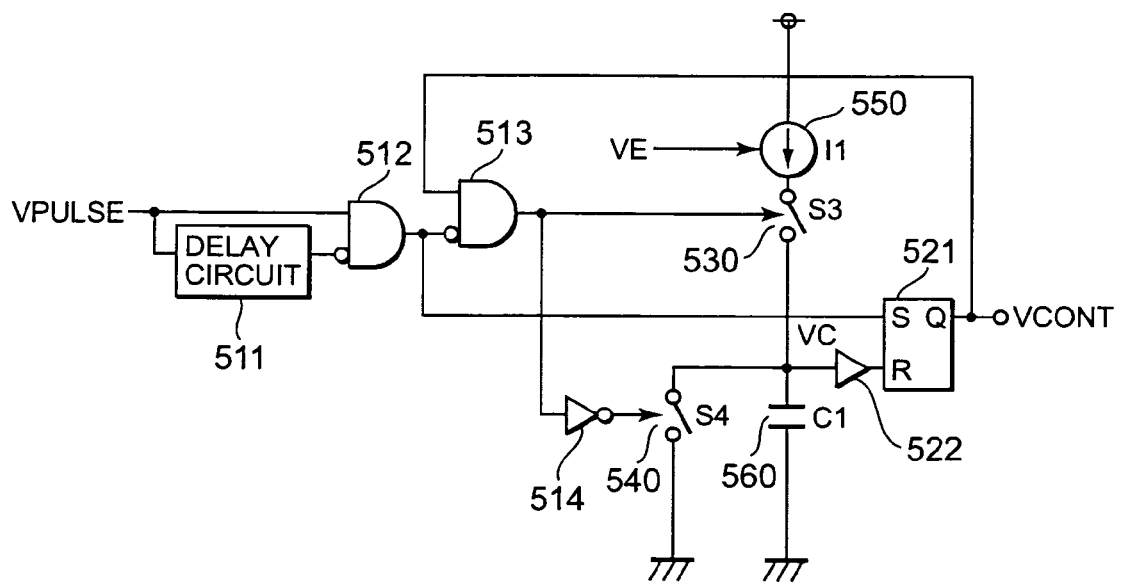
FIG. 4B is a block circuit diagram showing a concrete example for realizing the ON-period adjusting circuit shown in FIG. 4A.

FIG. 4B is a block circuit diagram showing a concrete example for realizing the ON-period adjusting circuit shown in FIG. 4A.

First logic circuit 510 shown in FIG. 4A is formed of tdr delay circuit 511, first AND circuit 512, second AND circuit 513 and inverter 514 in FIG. 4B. Second logic circuit 520 shown in FIG. 4A is formed of RS flip-flop circuit (hereinafter referred to as "RSFF") 521 and buffer 522. First AND circuit 512 receives the output VPULSE from pulse oscillator 436 as a first input. First AND circuit 512 inverts the delayed output VPLUSE delayed by tdr delay circuit 511 and receives the delayed output VPLUSE inverted as a second input. First AND circuit 512 feeds the output thereof to the set (S) terminal of RSFF 521 in second logic circuit 520. Thus, first logic circuit 510 transmits the signal delayed for a predetermined period (tdr) to second logic circuit 520.

First AND circuit 512 feeds the output thereof to the first input terminal of second AND circuit 513. The inverted output of first AND circuit 512 and the Q output from RSFF 521 in second logic circuit 520 are inputted to second AND circuit 513. The output from second AND circuit 513 is used for controlling the switching on and off of switch S3 (530) and switch S4 (540).

RSFF 521 in second logic circuit 520 outputs from the Q output terminal thereof a HIGH signal or a LOW signal depending on the input logic conditions at the set (S) terminal and the reset (R) terminal thereof. Buffer 522 is disposed in the front stage of the R terminal of RSFF 521 for adjusting the threshold at the VC terminal. Buffer 522 may be formed of two stages of inverters not shown. For directly adjusting the threshold at the R terminal of RSFF 521, it is not necessary to dispose buffer 522.

Figure 5A:
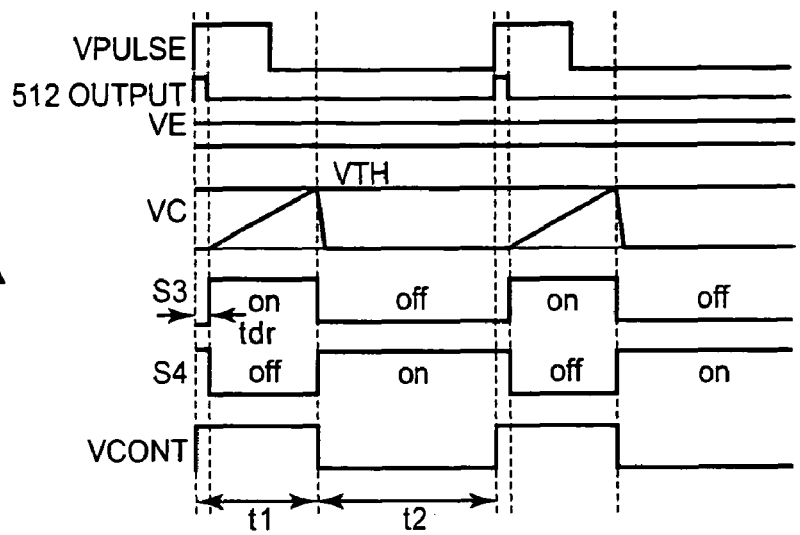
FIG. 5(a) shows waveforms illustrating the operation of the ON-period adjusting circuit shown in FIGS. 4(A) and 4(B) when the ON-period ratio is an intermediate one.
Figure 5B:
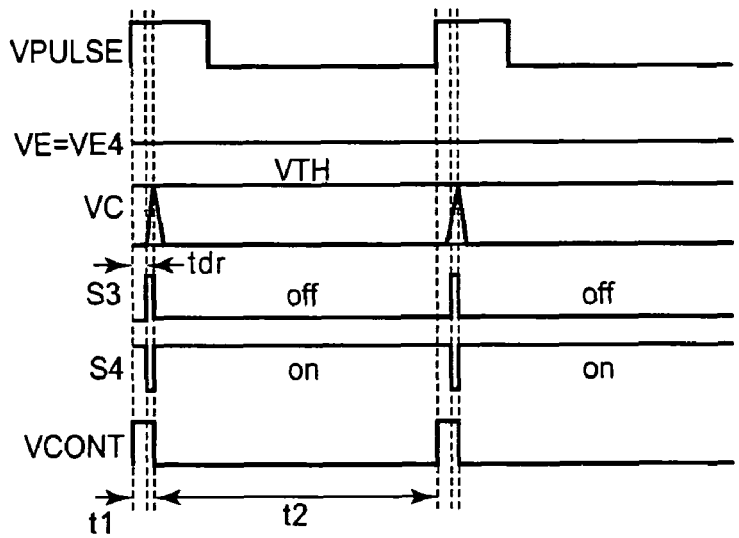
FIG. 5(b) shows waveforms illustrating the operation of the ON-period adjusting circuit shown in FIGS. 4(A) and 4(B) when the ON-period ratio is the minimum one.
Figure 5C:
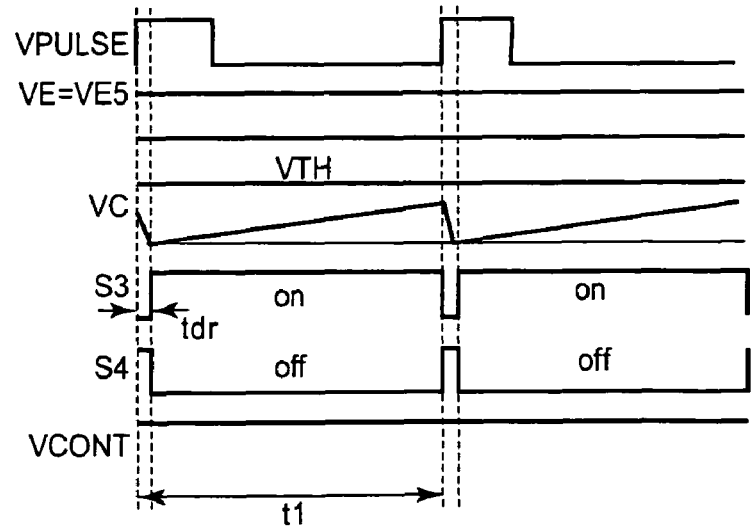
FIG. 5(c) shows waveforms illustrating the operation of the ON-period adjusting circuit shown in FIGS. 4(A) and 4(B) when the ON-period ratio is the maximum one.

FIG. 5(a) shows waveforms illustrating the operation of the ON-period adjusting circuit shown in FIGS. 4(A) and 4(B) when the ON-period ratio is an intermediate one. FIG. 5(b) shows waveforms illustrating the operation of the ON-period adjusting circuit shown in FIGS. 4(A) and 4(B) when the ON-period ratio is the minimum one. FIG. 5(c) shows waveforms illustrating the operation of the ON-period adjusting circuit shown in FIGS. 4(A) and 4(B) when the ON-period ratio is the maximum one.

First, the operation of the ON-period adjusting circuit shown in FIGS. 4(A) and 4(B) conducted with an intermediate ON-period ratio is described with reference to FIG. 5(a). A short while after the output VPULSE from pulse oscillator 436 (cf. FIG. 1) becomes LOW, switch S3 (530) is caused to be OFF and switch S4 (540) to be ON by first logic circuit 510, setting the VC terminal at 0 V. The Q output from RSFF 521 is LOW. The PWM signal (VCONT), that is the output from second logic circuit 520, is set at the LOW level.

Then, as the output VPULSE becomes HIGH, a signal continuously HIGH for the period tdr is outputted from first AND circuit 512, setting RSFF 521. As a result, the Q output from RSFF 521 becomes HIGH. The output from second AND circuit 513 remains LOW until the output from first AND circuit 512 becomes LOW, since the AND condition for the inputs to second AND circuit 513 does not hold. Therefore, first logic circuit 510 delays to switch on switch S3 (530) and to switch off switch S4 (540) for the delay time tdr from the time point, at which the output VPULSE becomes HIGH. Then, first logic circuit 510 switches on switch S3 (530) and off switch S4 (540) to electrify capacitor C1 (560) with the current I1 determined by the error signal VE. As capacitor C1 (560) is electrified, the VC terminal potential starts rising.

As the output VPULSE becomes HIGH, the output from first AND circuit 512 in first logic circuit 510 becomes HIGH immediately. Since the HIGH output from first AND circuit 512 sets the Q output from RSFF 521 at the HIGH level, the PWM signal (VCONT), that is the output from second logic circuit 520, is set to be HIGH. As the VC terminal potential reaches the threshold voltage VTH of the input to second logic circuit 520, the reset (R) input to RSFF 521 in second logic circuit 520 becomes active, setting the Q output from RSFF 521 to be LOW. (Here, the threshold voltage VTH of the input to second logic circuit 520 is the threshold of buffer 522 or the R (reset) terminal threshold of RSFF 521.) As a result, the PWM signal (VCONT), that is the output from second logic circuit 520, is set to be LOW and first logic circuit 510 switches off switch S3 (530) and switches on switch S4 (540), setting the VC terminal again at 0 V. By repeating the operations described above, the PWM signal (VCONT) is generated from the output of second logic circuit 520.

Next, the operation of the ON-period adjusting circuit shown in FIGS. 4(A) and 4(B) conducted with the minimum ON-period ratio is described with reference to FIG. 5(b).

As switch S3 (530) is switched on and switch S4 (540) is switched off while the error signal VE is low and voltage-controlled current source I1 (550) is outputting the current I1 at the set maximum value thereof, the VC terminal potential rises instantaneously. As the rising VC terminal potential reaches the threshold voltage VHT of the input to second logic circuit 520, the output from second logic circuit 520 shifts from the HIGH-state to the LOW-state. Therefore, PWM signal (VCONT), that is the output from second logic circuit 520, is shifted from the HIGH-state to the LOW-state.

If the response delay of the logic circuits and the switches is ignored, the minimum HIGH-period t1 of the PWM signal (VCONT) will be given by the following formula.

$$t1 = tdr + C1 \times VTH/I1$$

Since the period tdr can be set around several ns, the minimum ON-period ratio D can be set to be 1% or smaller in the same manner as in FIG. 3(b), when the switching frequency is 1 MHz for example.

Now the operation of the ON-period adjusting circuit shown in FIGS. 4(A) and 4(B) conducted with the maximum ON-period ratio is described with reference to FIG. 5(c).

After switch S3 (530) shifts to the ON-state and switch S4 (540) to the OFF-state while the error signal VE rises and voltage-controlled current source I1 (550) is outputting the current I1 at the set minimum value thereof, the output from second logic circuit 520 is in the HIGH-state. The output from second logic circuit 520, that is the Q output from RSFF 521, keeps the HIGH-state thereof until the output VPULSE from pulse oscillator 436 (cf. FIG. 1) rises again from the LOW-state to the HIGH-state. Therefore, the PWM signal (VCONT), that is the output from second logic circuit 520, remains in the HIGH-state thereof. Subsequently, the output from second AND circuit 513 in first logic circuit 510 is set at the LOW-state for the period tdr, since the output from first AND circuit 512 in first logic circuit 510 shifts to the HIGH-state.

The period tdr is set for resetting the VC terminal potential at 0 V in the early state of the next cycle, when the VC terminal potential fails to reach the threshold voltage VTH of the input to second logic circuit 520 before the output VPULSE from pulse oscillator 436 (cf. FIG. 1) rises again from the LOW-state to the HIGH-state after switch S3 (530) shifts to the ON-state and switch S4 (540) to the OFF-state. Since the output from second logic circuit 520 remains in the HIGH-state even in the period tdr in the case of FIG. 5(c), the minimum LOW-period t2 of the PWM signal (VCONT) is 0 s. Therefore, the maximum ON-period ratio D can be set at 100%.

Figure 6A:
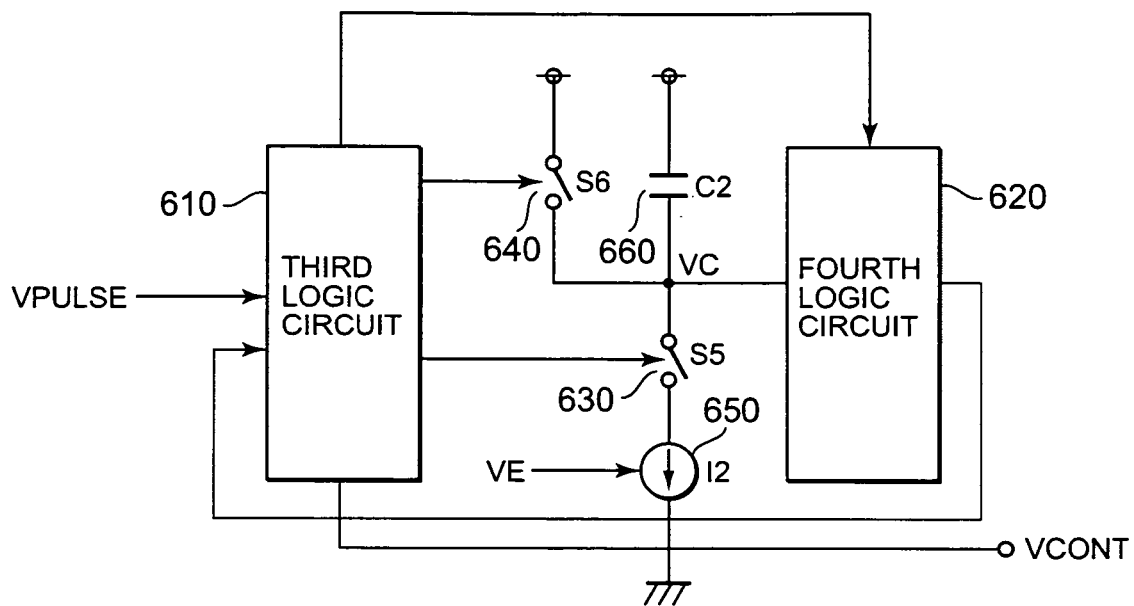
FIG. 6A is a block diagram showing a second example for realizing the ON-period adjusting circuit shown in FIG. 1.

FIG. 6A is a block diagram showing a second example for realizing the ON-period adjusting circuit shown in FIG. 1.

The ON-period adjusting circuit shown in FIG. 6A includes third logic circuit 610, fourth logic circuit 620, switch S5 (630), switch S6 (640), voltage-controlled current source I2 (650) controlled by the error signal VE, and capacitor C2 (660). The vertical positional relations of the constituent elements in FIG. 6A are opposite to the vertical positional relations of the constituent elements in FIG. 2A. Since the operation principle of the circuit and the relations between the signals and the circuit elements in FIG. 6A are the same with those in FIG. 2A, their duplicated descriptions will be omitted. Since the concrete configuration for the circuit in FIG. 6A can be configured in the same manner as the concrete circuit example shown in FIG. 2B, the duplicated description will be omitted.

Figure 6B:
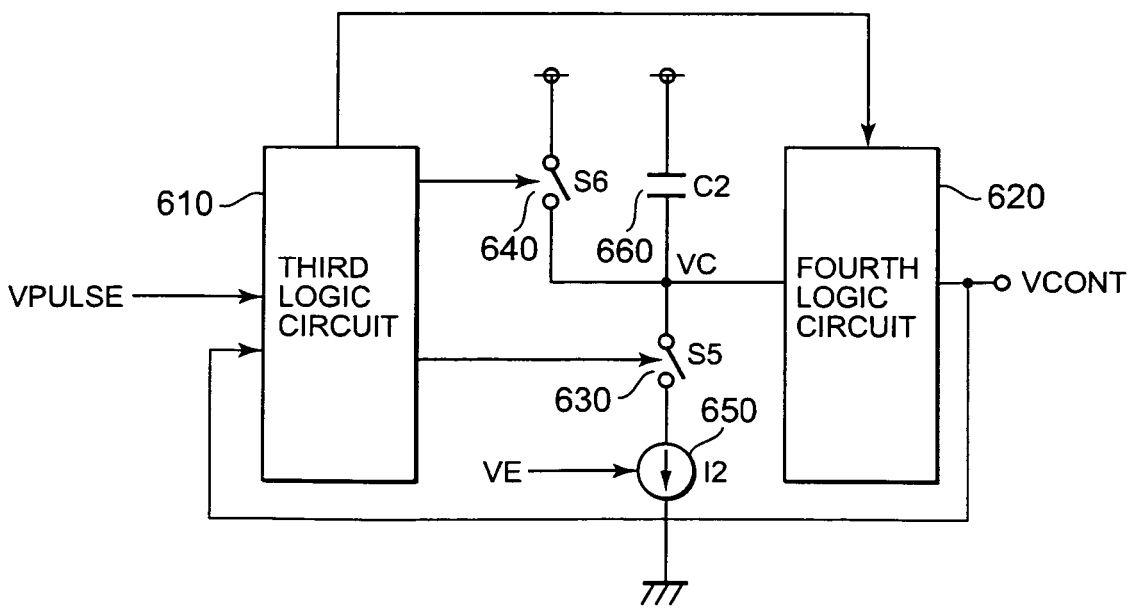
FIG. 6B is a block diagram showing a modified example of the ON-period adjusting circuit shown in FIG. 6A.

FIG. 6B is a block diagram showing a modified example of the ON-period adjusting circuit shown in FIG. 6A.

In the same manner as the circuit shown in FIG. 6A, the modified ON-period adjusting circuit shown in FIG. 6B includes third logic circuit 610, fourth logic circuit 620, switch S5 (630), switch S6 (640), voltage-controlled current source I2 (650) controlled by the error signal VE, and capacitor C2 (660). In FIG. 6B, the vertical positional relations of the constituent elements are opposite to the vertical positional relations of the constituent elements in FIG. 4A. Since the operation principle of the circuit and the relations between the signals and the circuit elements in FIG. 6B are the same with those in FIG. 4A, their duplicated descriptions will be omitted. Since the concrete configuration for the circuit shown in FIG. 6B can be configured in the same manner as the concrete circuit example shown in FIG. 4B, the duplicated description will be omitted.

Although the delay period tdr is generated by the tdr delay circuit in FIGS. 2B and 4B, the HIGH-period of the pulse oscillator output VPULSE can be set at tdr and used for the delay period tdr. In this case, the switch S3 in FIGS. 2A and 4A or the switch S5 in FIGS. 6A and 6B is switched from the OFF-state to the ON-state at the timing, at which the pulse oscillator output VPULSE shifts from the HIGH-state to the LOW-state. Simultaneously, the switch S4 in FIGS. 2A and 4A or the switch S6 in FIGS. 6A and 6B is switched from the ON-state to the OFF-state.

In connection with the circuits and the operations thereof described with reference to FIGS. 2A through 6B, the signal polarities may be reversed appropriately as far as the logical consistency is secured.

As described so far, the ON-period ratio range is widened greatly by the concrete circuit examples described with reference to FIGS. 2A through 6B. However, any technique, that realizes the minimum ON-period ratio of 0% and the maximum ON-period ratio of 100% by one single circuit, has not been disclosed yet. In the following, an example, that facilitates realizing the minimum ON-period ratio of 0% and the maximum ON-period ratio of 100% by one single circuit, will be described.

Figure 7A:
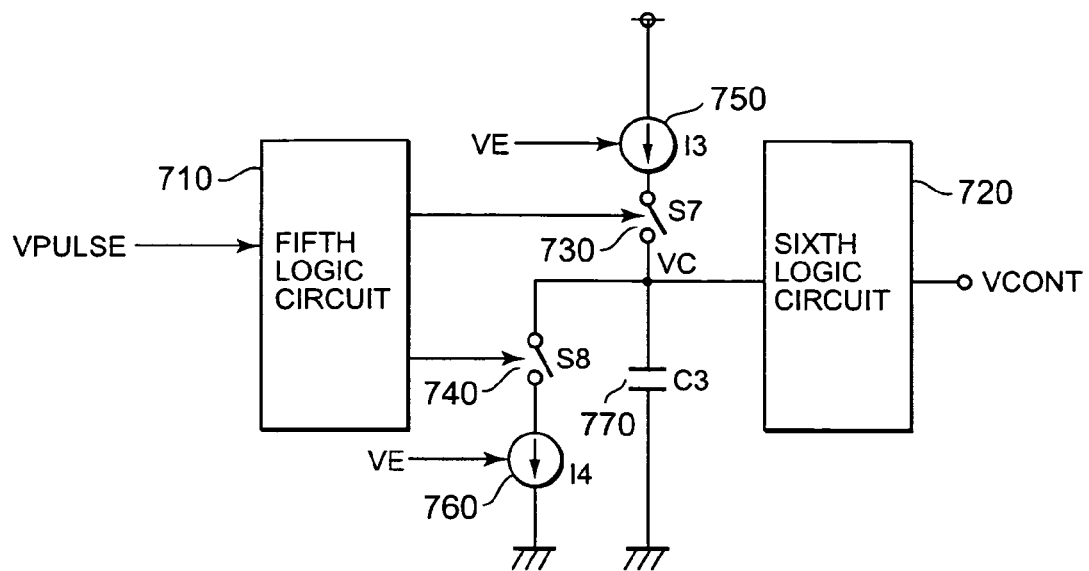
FIG. 7A is a block diagram showing a third example for realizing the ON-period adjusting circuit shown in FIG. 1.

FIG. 7A is a block diagram showing a third example for realizing the ON-period adjusting circuit shown in FIG. 1. The ON-period adjusting circuit shown in FIG. 7A includes fifth logic circuit 710, sixth logic circuit 720, switch S7 (730), switch S8 (740), voltage-controlled current source I3 (750) controlled by the error signal VE, voltage-controlled current source I4 (760) controlled by the error signal VE, and capacitor C3 (770).

Figure 7B:
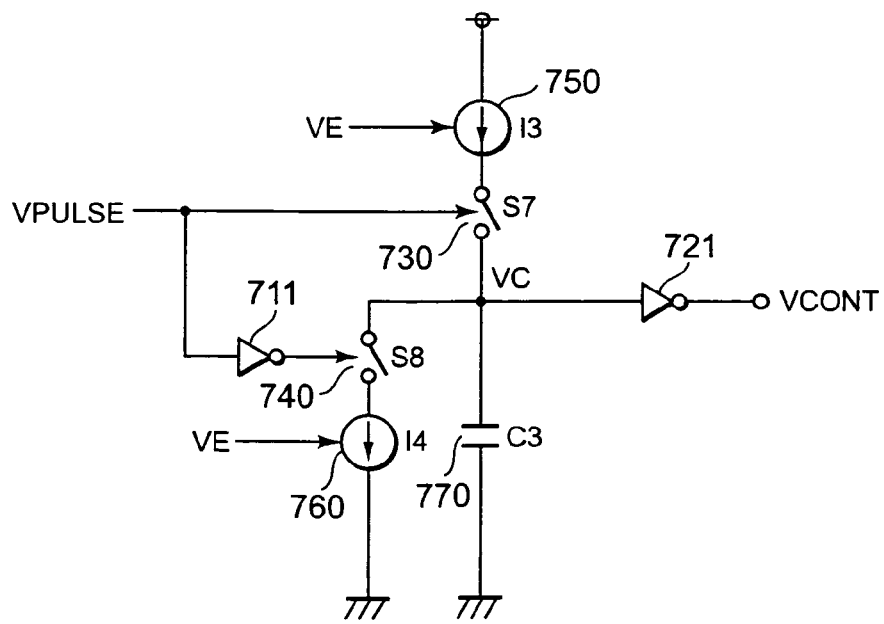
FIG. 7B is a block circuit diagram showing a concrete example for realizing the ON-period adjusting circuit shown in FIG. 7A.

FIG. 7B is a block circuit diagram showing a concrete example for realizing the ON-period adjusting circuit shown in FIG. 7A. In FIG. 7B, fifth logic circuit 710 shown in FIG. 7A is configured such that fifth logic circuit 710 directly uses the output VPULSE from pulse oscillator 436 (cf. FIG. 1) for switching on and off switch S7 (730). In FIG. 7B, fifth logic circuit 710 is configured also such that fifth logic circuit 710 inverts the output VPULSE from pulse oscillator 436 and uses the inverted output VPULSE for switching on and off switch S8 (740). Sixth logic circuit 720 is configured such that sixth logic circuit 720 inverts the VC terminal potential by inverter 721 and outputs the inverted VC terminal potential as the PWM signal (VCONT).

Figure 8:
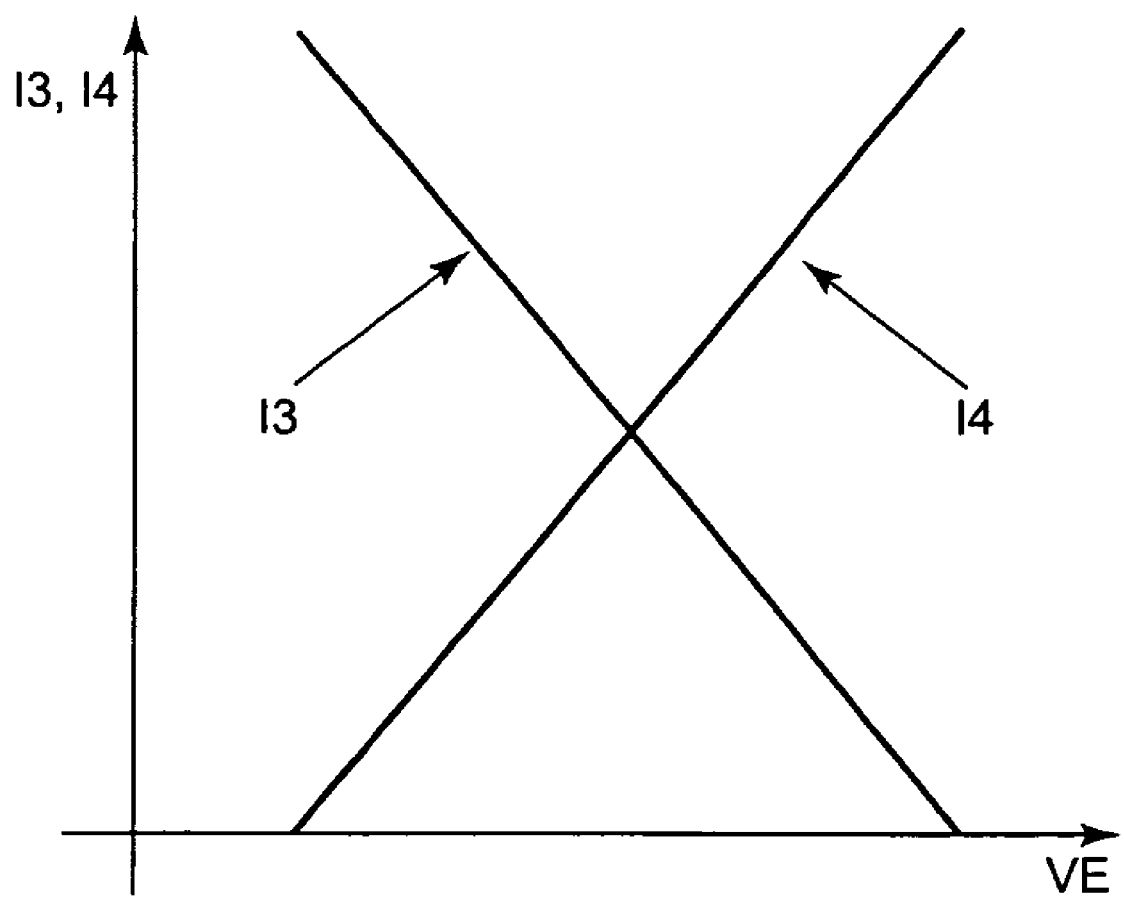
FIG. 8 is a graph relating the currents I3 and I4 from the voltage-controlled current sources shown in FIGS. 7A and 7B with the error signal VE.

FIG. 8 is a graph relating the currents I3 and I4 from the voltage-controlled current sources I3 and I4 shown in FIGS. 7A and 7B with the error signal VE. As shown in FIG. 8, the differential coefficient of the trans-conductance is negative for voltage-controlled current source I3 (750) and positive for voltage-controlled current source I4 (760) in the ON-period adjusting circuit according to the third example.

Figure 9A:
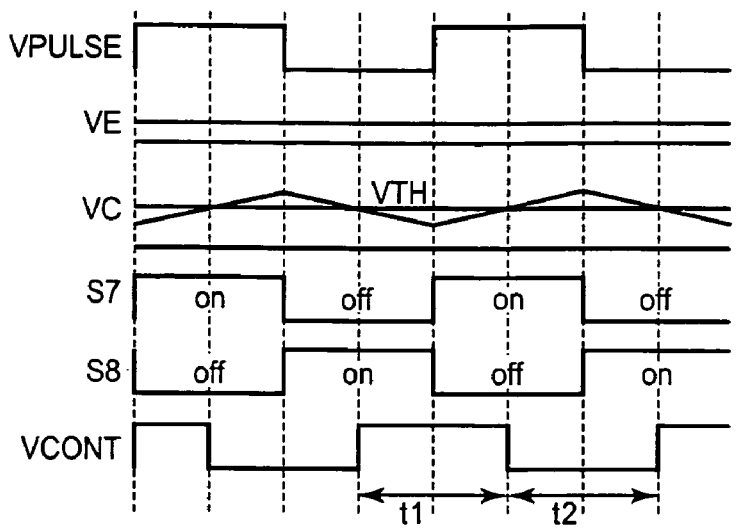
FIG. 9(a) shows waveforms illustrating the operation of the ON-period adjusting circuit shown in FIGS. 7(A) and 7(B) when the ON-period ratio is an intermediate one.
Figure 9B:
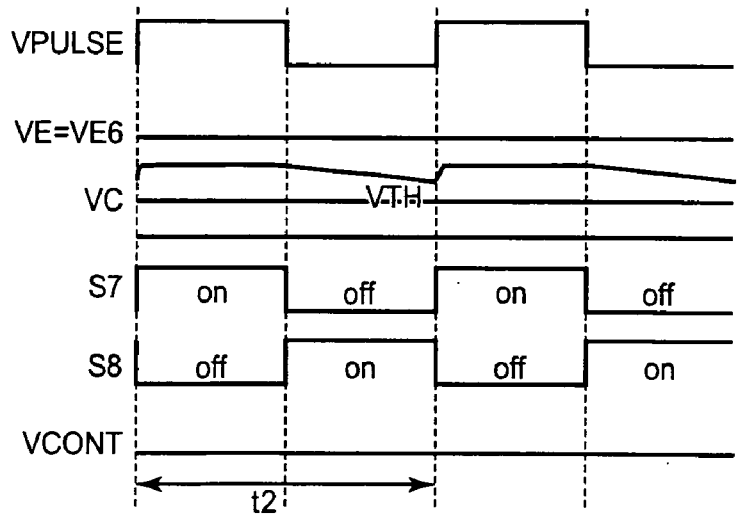
FIG. 9(b) shows waveforms illustrating the operation of the ON-period adjusting circuit shown in FIGS. 7(A) and 7(B) when the ON-period ratio is the minimum one.
Figure 9C:
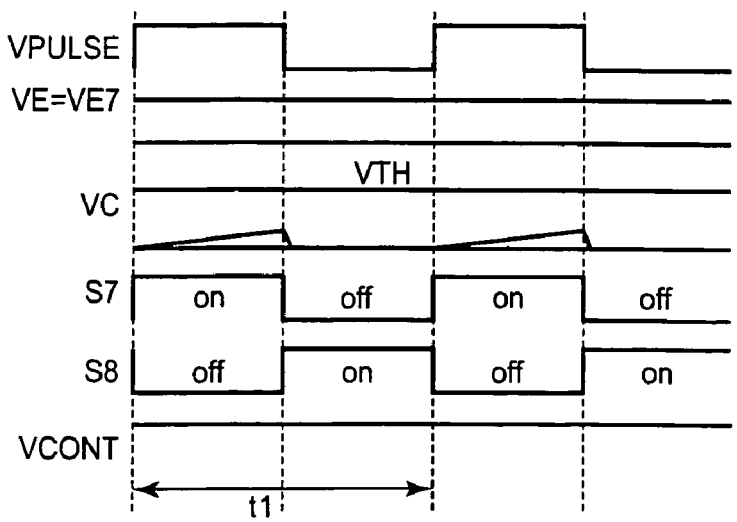
FIG. 9(c) shows waveforms illustrating the operation of the ON-period adjusting circuit shown in FIGS. 7(A) and 7(B) when the ON-period ratio is the maximum one.

FIG. 9(a) shows waveforms illustrating the operation of the ON-period adjusting circuit shown in FIGS. 7(A) and 7(B) when the ON-period ratio is an intermediate one. FIG. 9(b) shows waveforms illustrating the operation of the ON-period adjusting circuit shown in FIGS. 7(A) and 7(B) when the ON-period ratio is the minimum one. FIG. 9(c) shows waveforms illustrating the operation of the ON-period adjusting circuit shown in FIGS. 7(A) and 7(B) when the ON-period ratio is the maximum one.

First, the operation of the ON-period adjusting circuit shown in FIGS. 7(A) and 7(B) conducted with an intermediate ON-period ratio is described with reference to FIG. 9(a). While the output VPULSE from pulse oscillator circuit 436 (cf. FIG. 1) is LOW, fifth logic circuit 710 brings switch S7 (730) to the OFF-state and switch S8 (740) to the ON-state. While the output VPULSE from oscillator circuit 436 is HIGH, fifth logic circuit 710 brings switch S7 (730) to the ON-state and S8 (740) to the OFF-state. And, the threshold of the input to sixth logic circuit 720 is set at VTH.

Now the state, in which the output VPULSE from pulse oscillator circuit 436 is LOW, the VC terminal potential VC is lower than the threshold voltage VTH and sixth logic circuit 720 is outputting the PWM signal (VCONT) therefrom in the HIGH-state, is considered. As the output VPULSE from pulse oscillator circuit 436 shifts from the LOW-state to the HIGH-state, switch S7 (730) is brought to the ON-state and switch S8 (740) to the OFF-state. As switch S7 (730) is brought to the ON-state and switch S8 (740) to the OFF-state, capacitor C3 (770) is electrified with the current I3 from voltage-controlled current source I3 (750) controlled by the error signal VE and the VC terminal potential VC starts rising. As the VC terminal potential VC reaches the threshold voltage VTH, sixth logic circuit 720 sets the output signal thereof VCONT (PWM signal) to be LOW.

Then, as the output VPULSE from pulse oscillator circuit 436 shifts from the HIGH-state to the LOW-state, switch S7 (730) is brought to the OFF-state and switch S8 (740) to the ON-state. As switch S7 (730) is brought to the OFF-state and switch S8 (740) to the ON-state, capacitor C3 (770) is discharged with the current I4 from voltage-controlled current source I4 (760) controlled by the error signal VE and the VC terminal potential VC starts lowering. As the VC terminal potential VC reaches the threshold voltage VTH, sixth logic circuit 720 sets the output signal thereof VCONT (PWM signal) to be HIGH. By repeating the operations described above, the PWM signal (VCONT) is generated from the output of sixth logic circuit 720.

Next, the operation of the ON-period adjusting circuit shown in FIGS. 7(A) and 7(B) conducted with the minimum ON-period ratio is described with reference to FIG. 9(b). As the current I3 increases and the current I4 decreases with the lowering of the error signal VE as shown in FIGS. 8 and 9(b) and the VC terminal potential VC is higher than the threshold voltage VTH over a cycle, sixth logic circuit 720 keeps outputting the output signal VCONT in the LOW-state. In this state, the HIGH-period of the PWM signal (VCONT) t1 is 0 s, resulting in the minimum ON-period ratio D of 0%.

Now, the operation of the ON-period adjusting circuit shown in FIGS. 7(A) and 7(B) conducted with the maximum ON-period ratio is described with reference to FIG. 9(c). As the current I3 decreases and the current I4 increases with the rising of the error signal VE as shown in FIGS. 8 and 9(c) and the VC terminal potential VC is lower than the threshold voltage VTH over a cycle, sixth logic circuit 720 keeps outputting the output signal VCONT in the HIGH-state. In this state, the LOW-period of the PWM signal (VCONT) t2 is 0 s, resulting in the maximum ON-period ratio D of 100%.

As described above, the ON-period adjusting circuit according to the third example improves the ON-period ratio range greatly such that the minimum ON-period ratio of 0% and the maximum ON-period ratio of 100% are realized by the same circuit configuration.

Now, the case, in which the ratio of the ON-period of switch S7 (730) and the ON-period of switch S8 (740), that is the ratio of the electrifying period and the discharging period of capacitor C3 (770), is fixed, is described below. When the ratio of the ON-periods of switches S7 (730) and S8 (740) is fixed, the current I3 from voltage-controlled current source I3 (750) changes in response to the error signal VE and capacitor C3 (770) is electrified for the ON-period of switch S7 (730), the ON-period ratio thereof is fixed. The current I4 from voltage-controlled current source I4 (760) changes in response to the error signal VE and capacitor C3 (770) is discharged for the ON-period of switch S8 (740), the ON-period ratio thereof is fixed. Since the average voltage of capacitor C3 (770) increases and decreases from cycle to cycle, the ratio of the HIGH-period and the LOW-period of the output signal VCONT (PWM signal) is changed. In other words, the ratio of the HIGH-period and the LOW-period of the output signal VCONT (PWM signal) is controlled.

Figure 10:
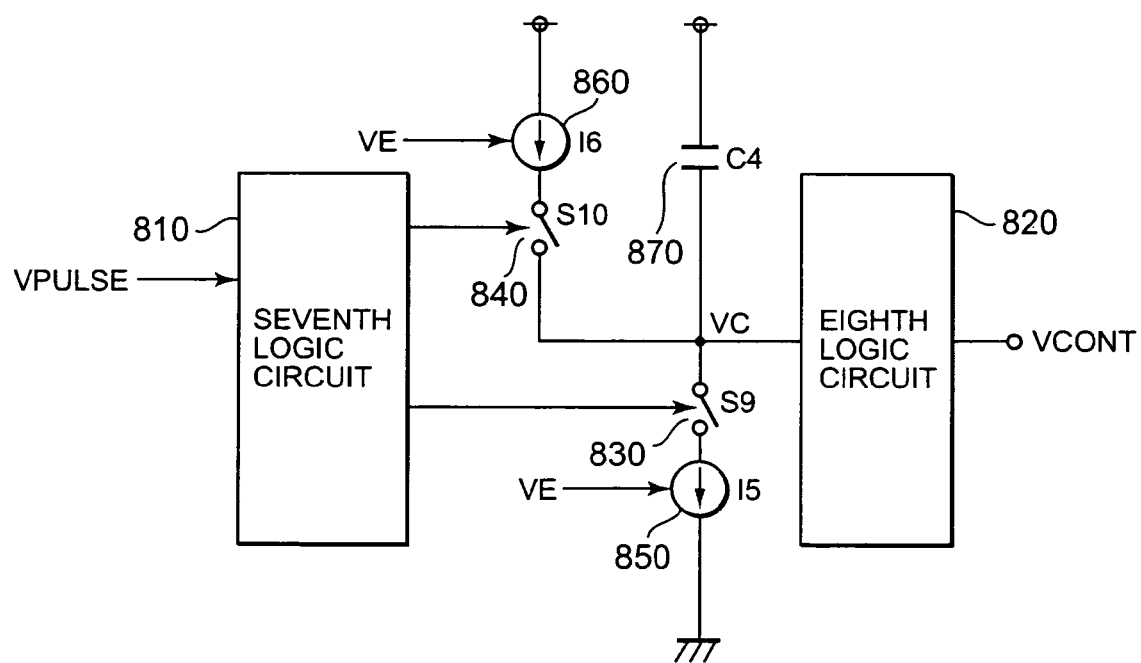
FIG. 10 is a block diagram of a fourth example for realizing the ON-period adjusting circuit shown in FIG. 1.

FIG. 10 is a block diagram of a fourth example for realizing the ON-period adjusting circuit shown in FIG. 1. The ON-period adjusting circuit shown in FIG. 10 includes seventh logic circuit 810, eighth logic circuit 820, switch S9 (830), switch S10 (840), voltage-controlled current source I5 (850) controlled by the error signal VE, voltage-controlled current source I6 (860) controlled by the error signal VE, and capacitor C3 (870). The vertical positional relations of the constituent elements in FIG. 10 are opposite to the vertical positional relations of the constituent elements in FIG. 7A. Since the operation principle of the circuit and the relations between the signals and the circuit elements in FIG. 10 are the same with those in FIG. 7A, their duplicated descriptions will be omitted. Since the concrete configuration for the circuit shown in FIG. 10 can be configured in the same manner as the concrete circuit example shown in FIG. 7B, the duplicated description will be omitted.

In connection with the circuits and the operations thereof described with reference to FIGS. 7A through 10, the signal polarities may be reversed appropriately as far as the logical consistency is secured.

Figure 11:
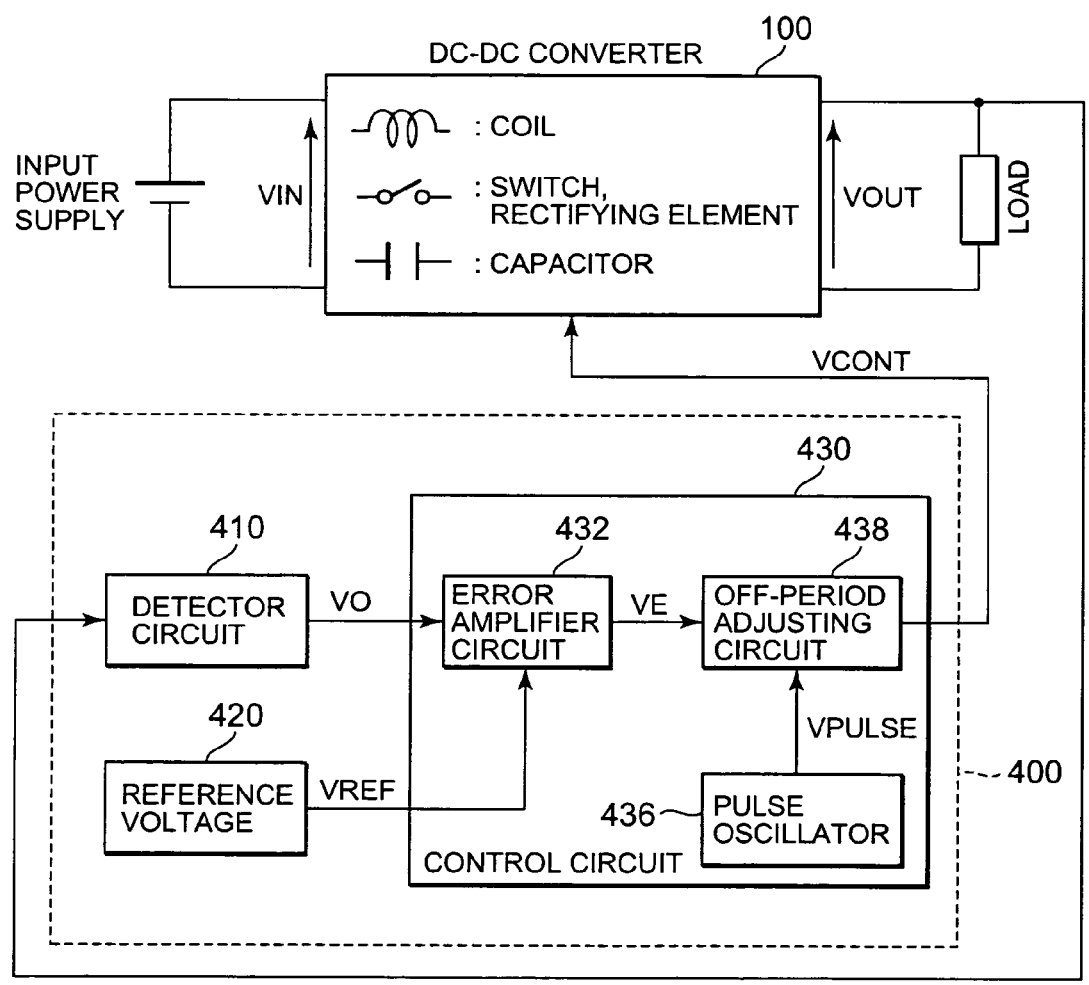
FIG. 11 is a block diagram of a switching power supply including a control circuit according to a second mode for carrying out the invention.
Figure 12:
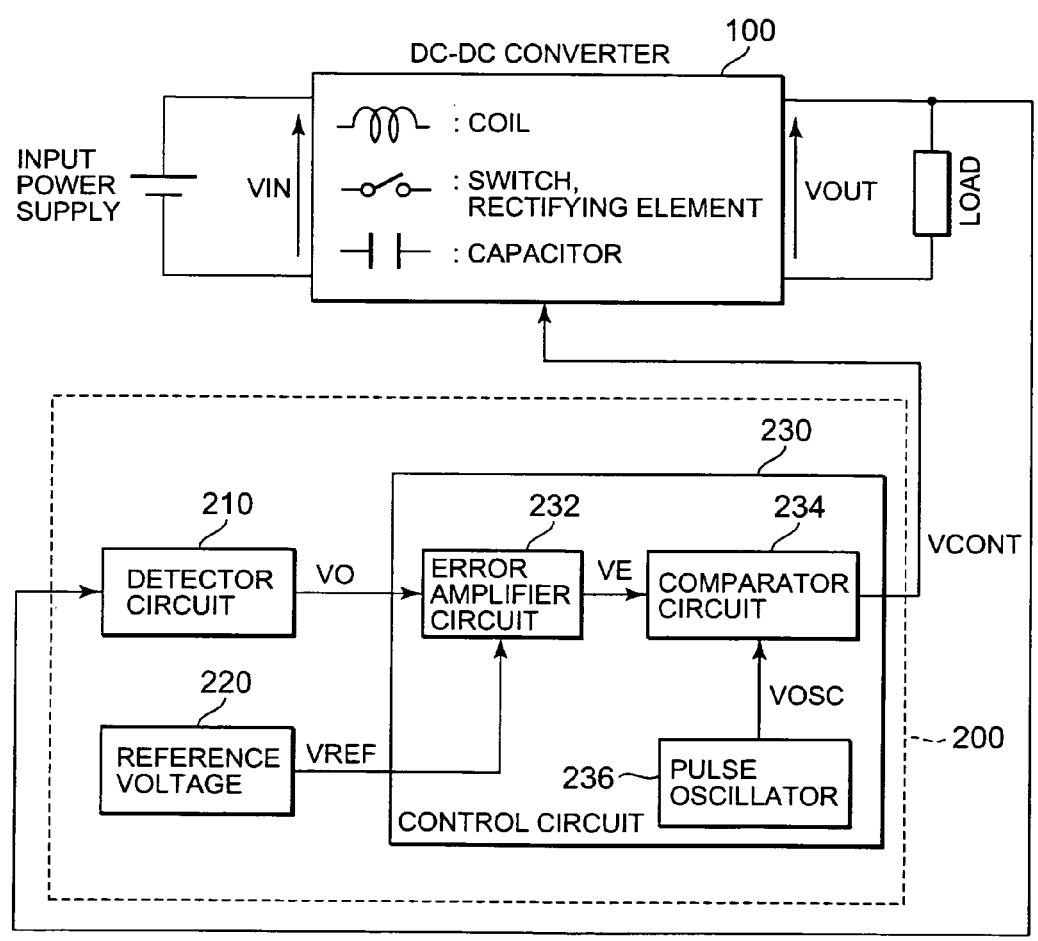
FIG. 12 is a block diagram showing the general structure of a conventional switching power supply.
Figure 13:
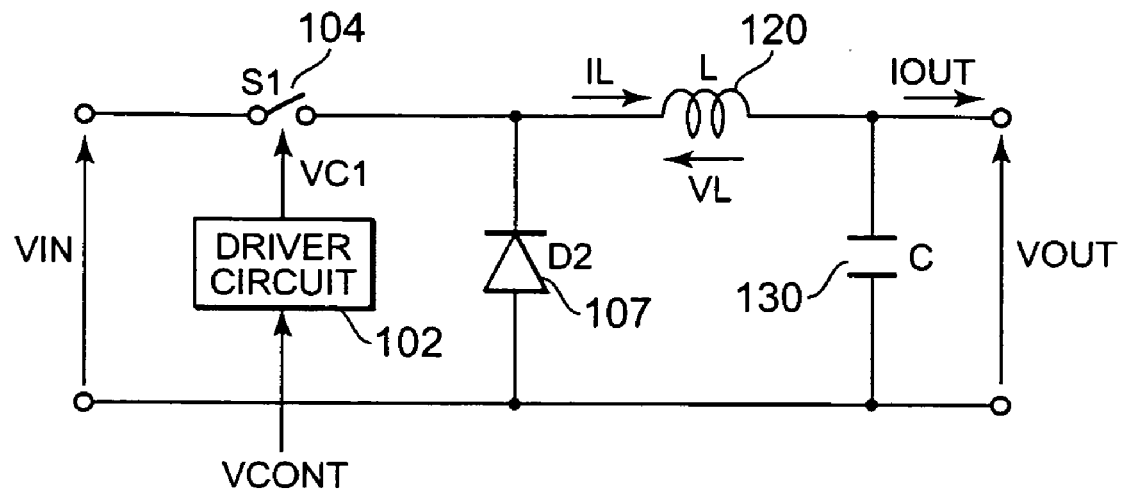
FIG. 13 is a block circuit diagram of a first buck converter used as the DC-DC converter in FIG. 12.
Figure 14:
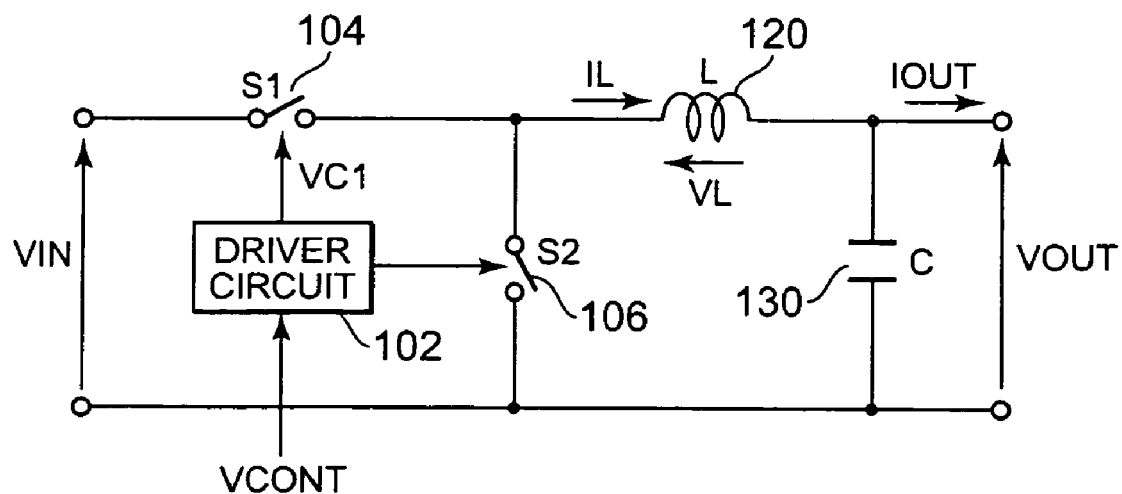
FIG. 14 is a block circuit diagram of a second buck converter used as the DC-DC converter in FIG. 12.
Figure 15:
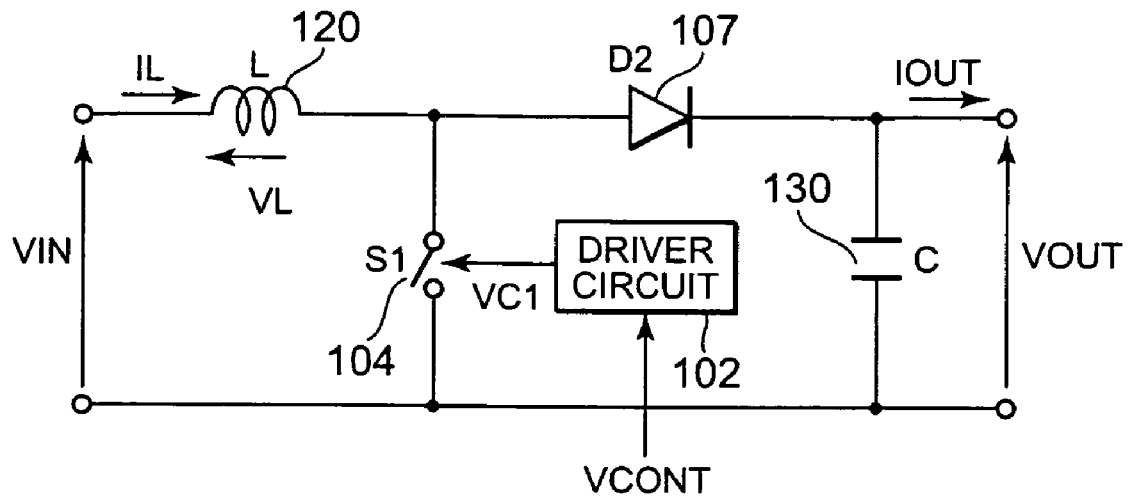
FIG. 15 is a block circuit diagram of a first boost converter used as the DC-DC converter in FIG. 12.
Figure 16:
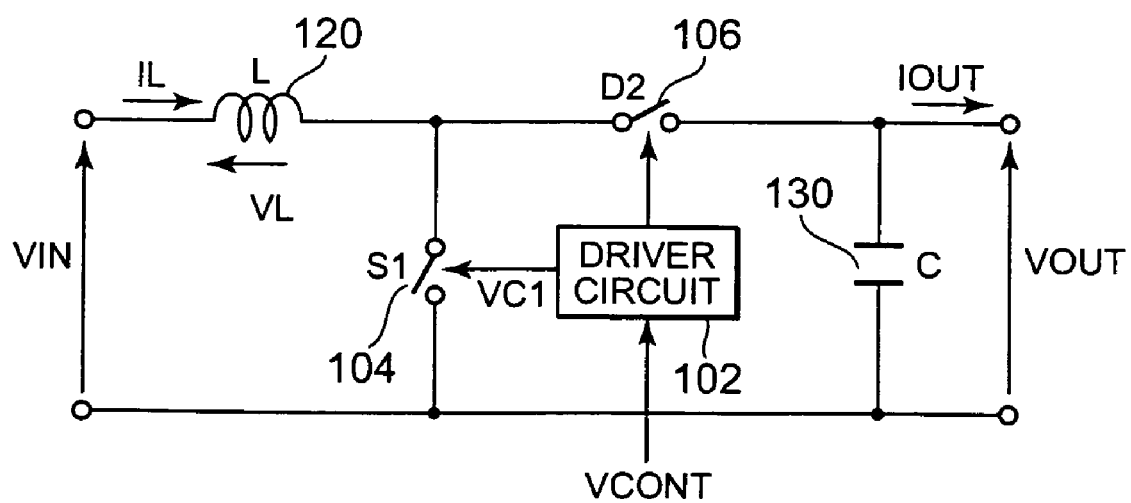
FIG. 16 is a block circuit diagram of a second boost converter used as the DC-DC converter in FIG. 12.
Figure 17:
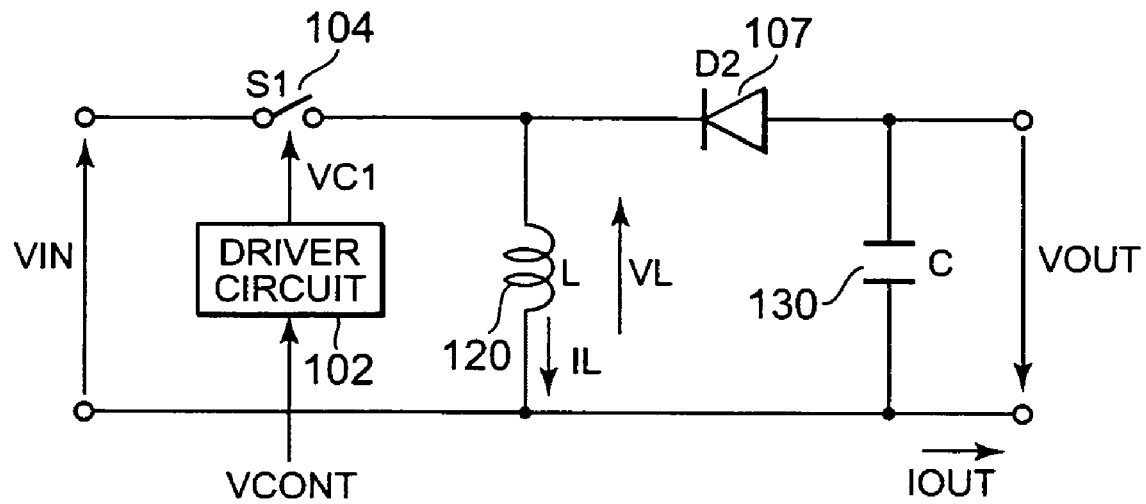
FIG. 17 is a block circuit diagram of a first buck-boost converter used as the DC-DC converter in FIG. 12.
Figure 18:
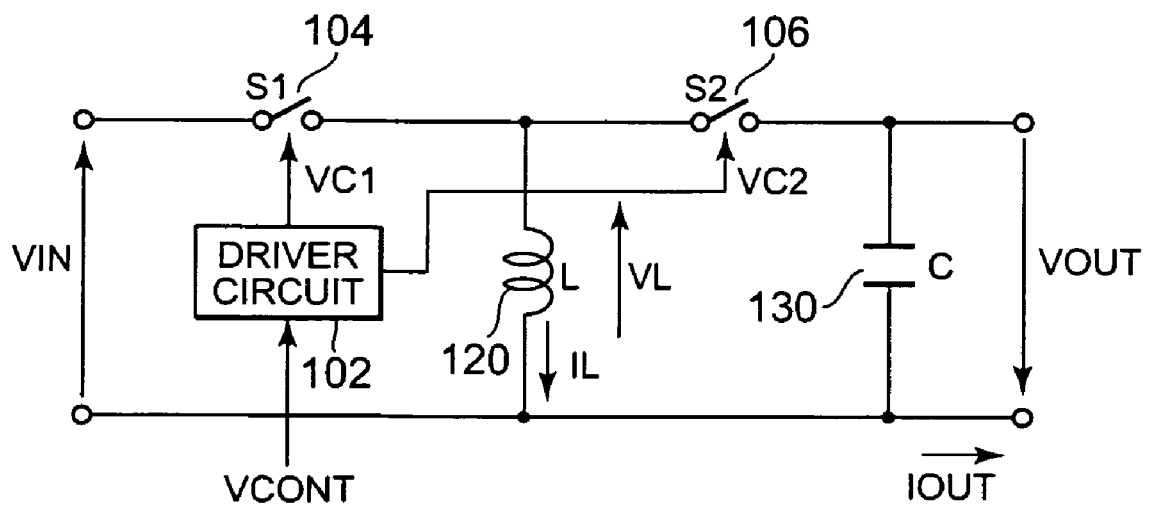
FIG. 18 is a block circuit diagram of a second buck-boost converter used as the DC-DC converter in FIG. 12.
Figure 19:
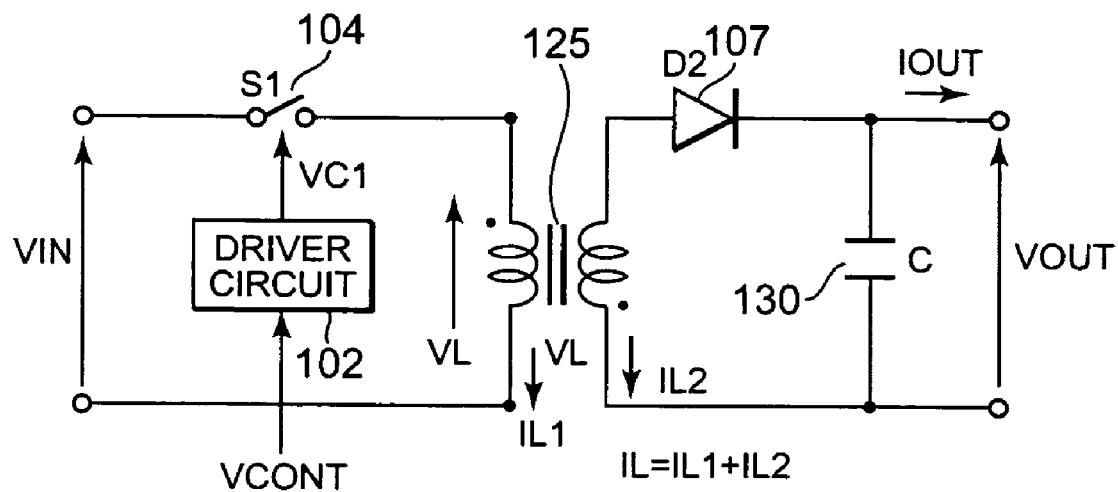
FIG. 19 is a block circuit diagram of a first flyback converter used as the DC-DC converter in FIG. 12.
Figure 20:
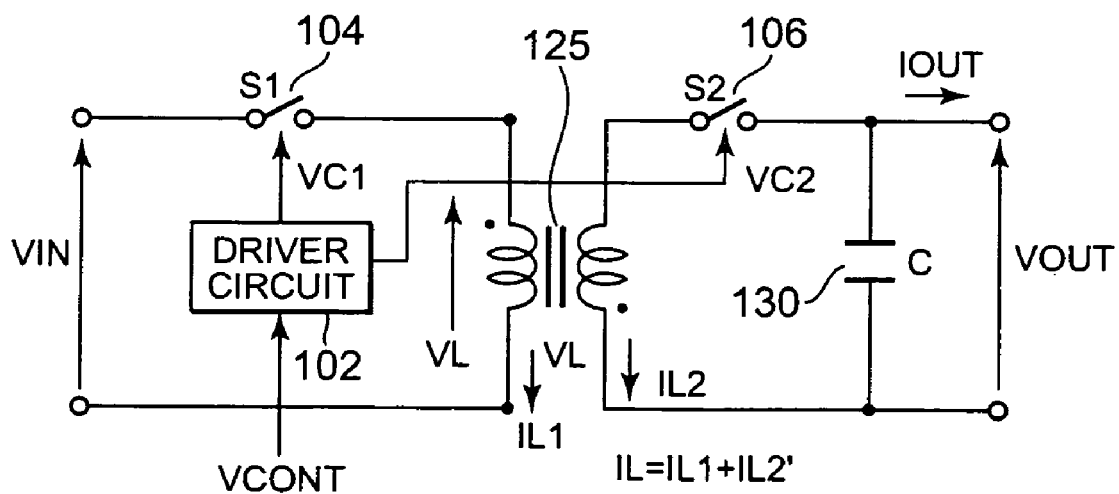
FIG. 20 is a block circuit diagram of a second flyback converter used as the DC-DC converter in FIG. 12.
Figure 21:
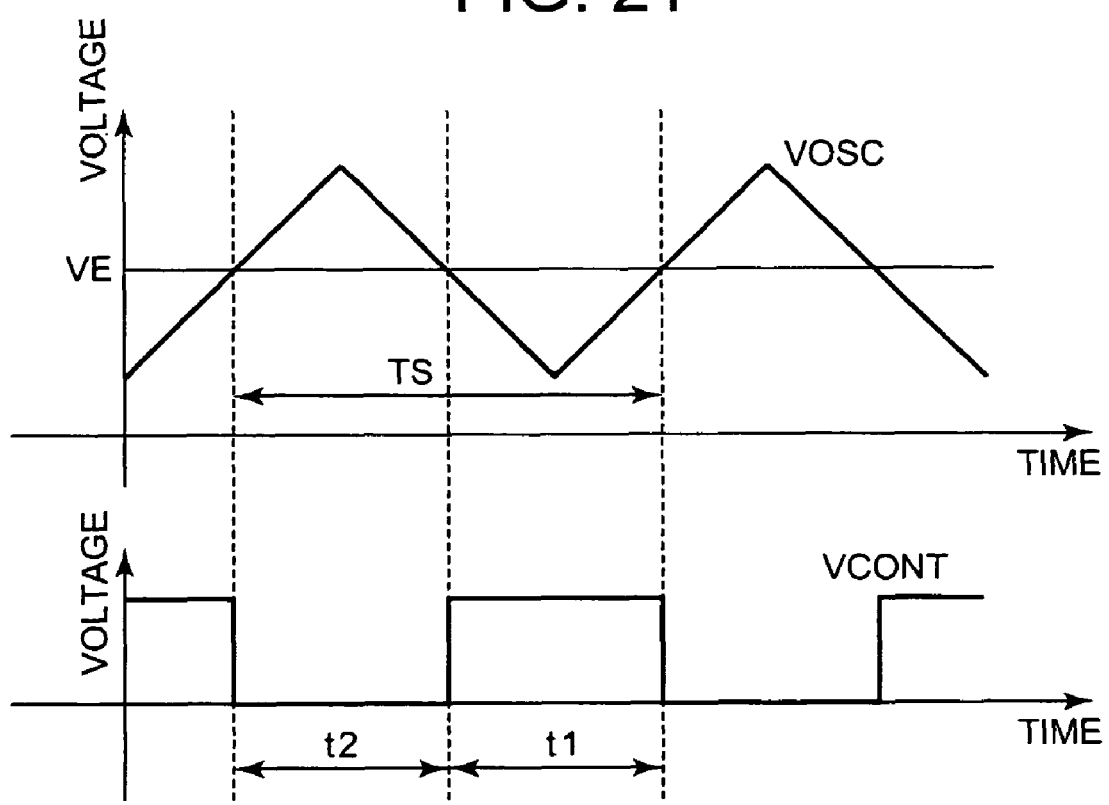
FIG. 21 shows waveforms that schematically illustrates the operation waveforms of a conventional converter control section.
Figure 22:
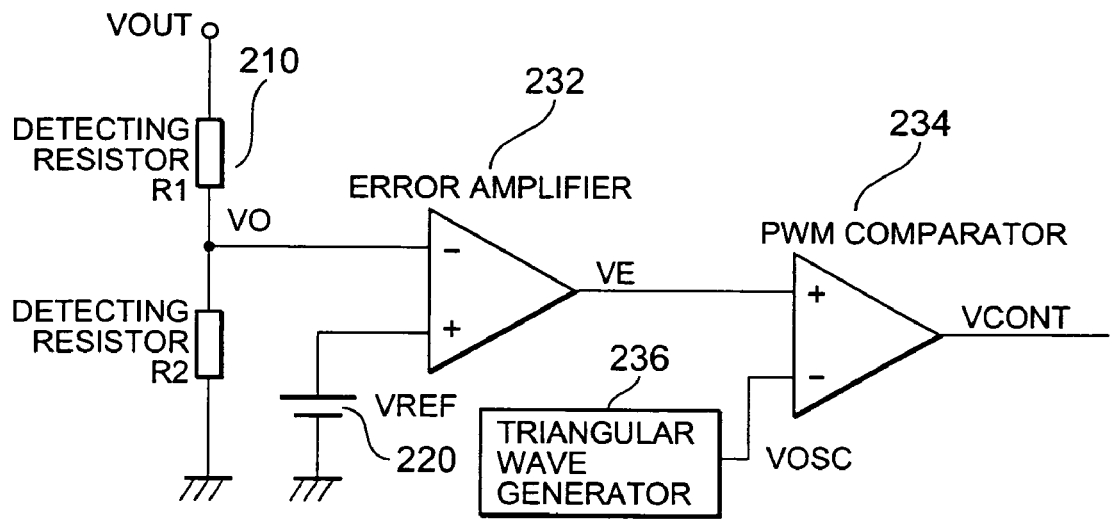
FIG. 22 is a block circuit diagram showing the structural example of a conventional converter control section.
Figure 23A:
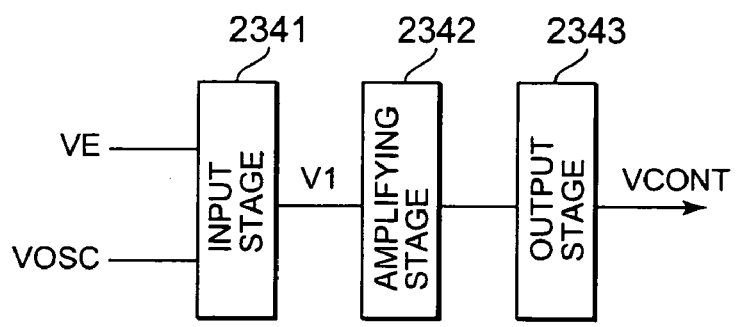
FIG. 23A is a block functional diagram describing the signal processing process of the comparator in the conventional converter control section.
Figure 23B:
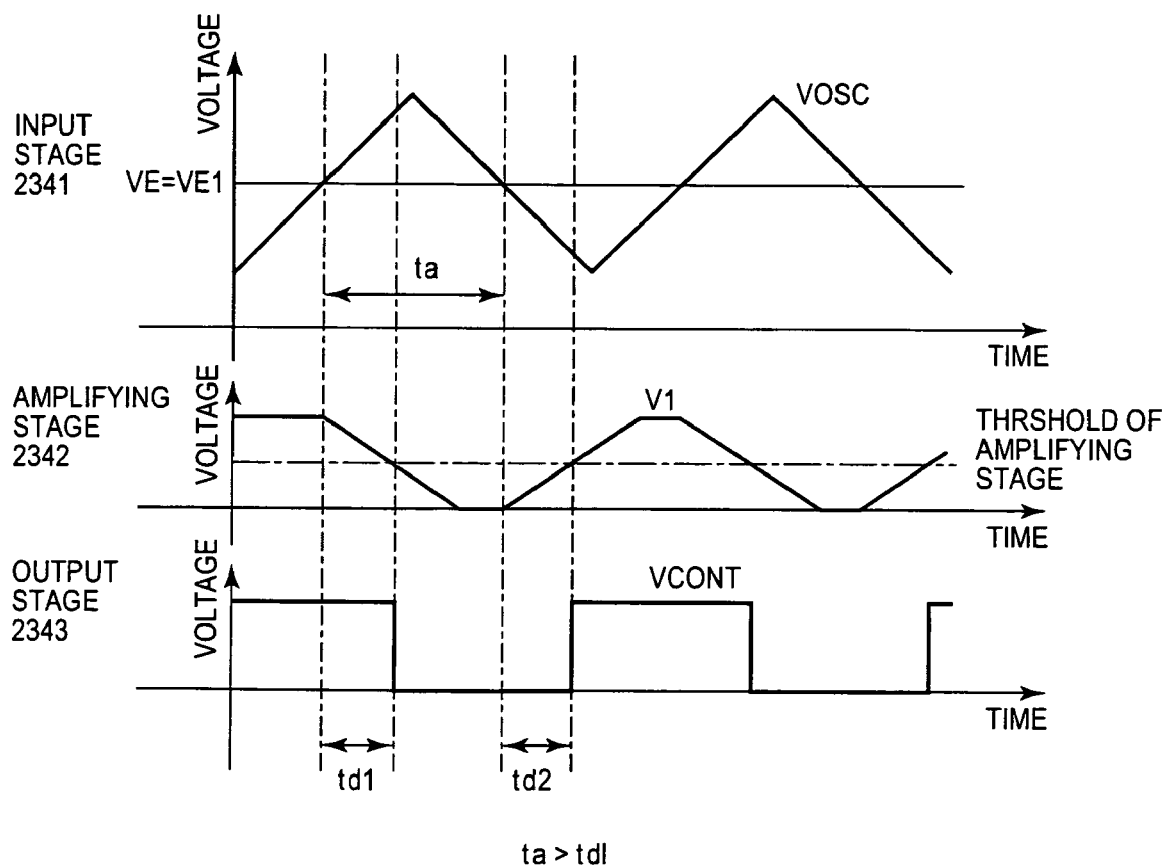
FIG. 23B shows waveforms illustrating the first operation waveforms of the comparator in the conventional converter control section.
Figure 24:
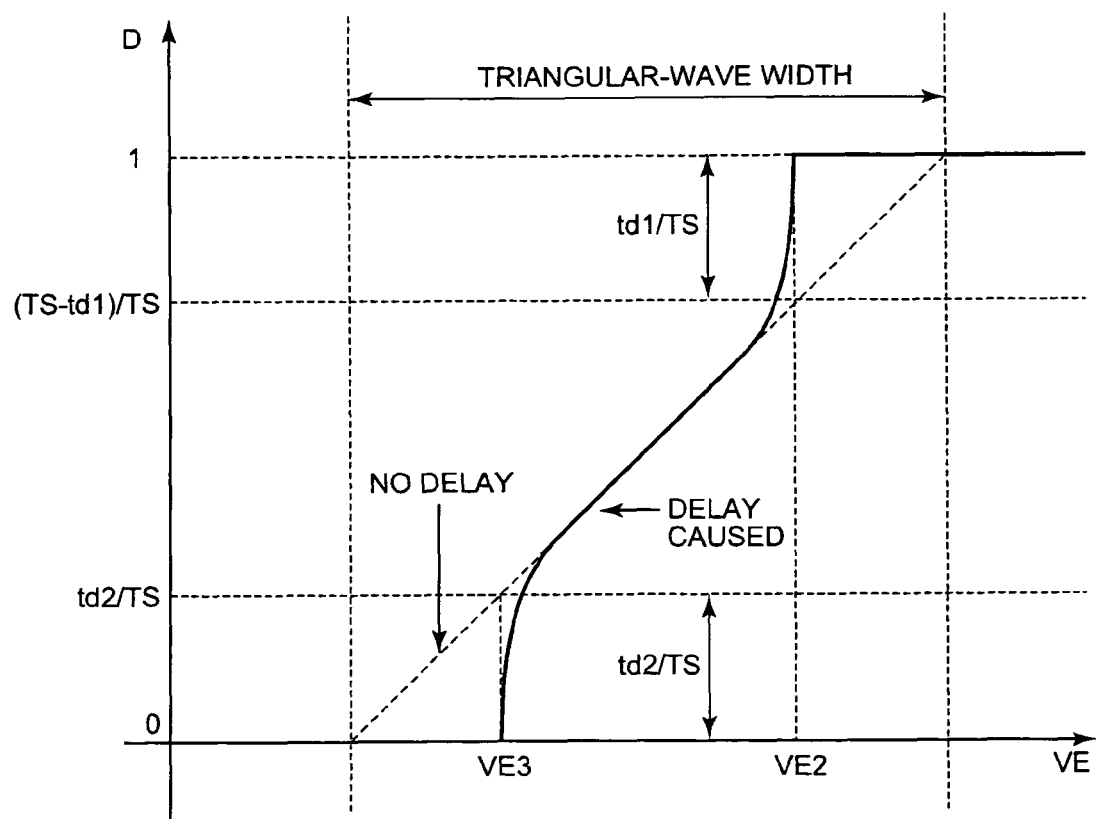
FIG. 24 is a graph relating the ON-period ratio D in the conventional converter control section shown in FIG. 22 with the error signal

The ON-period adjusting circuits according to the first mode for carrying out the invention are described principally at controlling the ON-period of the main switch in the switching power supply. Alternatively, the OFF-period of the main switch in the switching power supply can be controlled with no problem. FIG. 11 is a block diagram of a switching power supply including a control circuit according to a second mode for carrying out the invention. Various inverters and converters are used for the switching power supply according to the second mode for carrying out the invention. Hereinafter, the switching power supply according to the second mode will be described in connection with a DC-DC converter as a typical example.

As shown in FIG. 11, control circuit 430 according to the second mode for carrying out the invention includes error amplifier circuit 432, pulse oscillator 436, and OFF-period adjusting circuit 438. Error amplifier circuit 432 compares the voltage V0, obtained by detecting the output voltage VOUT from DC-DC converter 100, with a reference voltage VREF and outputs an error signal VE. Pulse oscillator 436 generates pulses shaped, for example, with a rectangular wave having a certain period. OFF-period adjusting circuit 438 outputs a PWM signal (VCONT) to control the ON and OFF of the main switch in DC-DC converter 100. In controlling the ON and OFF of the main switch, OFF-period adjusting circuit 438 starts generating PWM signals in the respective periods based on the pulses outputted from pulse oscillator 436. OFF-period adjusting circuit 438 adjusts the OFF-period, for which the PWM signal is the one for switching the main switch in the switching power supply off.

In the switching power supply shown in FIG. 11, OFF-period adjusting circuit 438 is configured such that the OFF-period of the main switch is adjusted based on the error signal VE outputted from error amplifier circuit 432. In other words, ON-period adjusting circuit 434 in FIG. 1 is replaced in FIG. 11 by OFF-period adjusting circuit 438. Since the other circuit configuration is the same with the circuit configuration shown in FIG. 1, the duplicated description will not be made.

Concrete examples of OFF-period adjusting circuit 438 can be configured in the same manner as the concrete examples of the ON-period adjusting circuit by securing the logical consistency in the circuit configurations and the operations described with reference to FIGS. 2A through 10.

According to the invention, the PWM control of the switching power supply is conducted without using the PWM comparator that is hazardous for precisely controlling the ON-period (or the OFF-period) of the switching device. Therefore, the HIGH-period ratio range or the LOW-period ratio range of the PWM signal is improved and widened greatly by determining the ON-period (or the OFF-period) of the switching device and by conducting the PWM control of the switching device according to the invention. The ON-period ratio control (or the OFF-period ratio control) according to the invention is applicable not only to the DC-DC converter but also to the other inverters and converters which employ the PWM control.

While the invention has been particularly shown and described with reference to preferred embodiments thereof, it will be understood by those skilled in the art that the foregoing and other changes in form and details can be made therein without departing from the spirit and scope of the present invention.

What is claimed is:

1. A control circuit for controlling a switching power supply, which switches on and off a switching device therein with a pulse-width-modulation signal at an adjusted ON-period ratio for regulating an output voltage therefrom by a pulse-width-modulation method, the control circuit comprising:
    an error amplifier circuit configured to compare the output voltage from the switching power supply with a reference voltage and output an error signal;
    a pulse generator circuit configured to generate a pulse, the period thereof being fixed; and
        an ON-period adjusting circuit configured to start generating the pulse-width-modulation signal in every cycle in response to the pulse outputted from the pulse generator circuit and adjust an ON-period, for which the pulse-width-modulation signal sets the switching device to be ON; wherein the ON-period adjusting circuit changes the ON-period in response to an output voltage of the error signal outputted from the error amplifier circuit for outputting a desired pulse-width-modulation signal.

2. The control circuit according to claim 1, wherein the ON-period adjusting circuit includes
    a voltage-controlled current source configured to be controlled by the output voltage of the error signal;
    a capacitor, electrifiable by the voltage-controlled current source, and configured to determine the ON-period by electrification thereof;
    a switch configured to change over the electrification and discharge of the capacitor; and
    a logic circuit configured to control whether the switch is ON or OFF.

3. The control circuit according to claim 2, wherein the ON-period adjusting circuit
    sets a predetermined delay period after the pulse is outputted from the pulse generator,
    starts electrifying the capacitor after the predetermined delay period has elapsed, and
    causes the pulse-width-modulation signal to switch off the switching device in the switching power supply during the delay period.

4. The control circuit according to claim 2, wherein the ON-period adjusting circuit
    sets a predetermined delay period after the pulse is outputted from the pulse generator,
    starts electrifying the capacitor after the predetermined delay period has elapsed, and
    causes the pulse-width-modulation signal to switch on the switching device in the switching power supply during the delay period.

5. The control circuit according to claim 1, wherein the ON-period adjusting circuit includes
    a first voltage-controlled current source configured to be controlled by the output voltage of the error signal;
    a second voltage-controlled current source configured to be controlled by the output voltage of the error signal;
    a capacitor, electrifiable by the first voltage-controlled current source and dischargeable by the second voltage-controlled current source, configured to determine the ON-period by electrification and discharge thereof;

a switch configured to change over the electrification and the discharge of the capacitor; and a logic circuit configured to control whether the switch is ON or OFF.

6. The control circuit according to claim 5, wherein
the ON-period adjusting circuit fixes a changeover period ratio, at which the electrification and the discharge of the capacitor are changed over; and the ON-period adjusting circuit increases and decreases an average voltage of the capacitor in response to a change caused by the output voltage of the error signal and a difference between an electrifying current from the first voltage-controlled current source and a discharging current from the second voltage-controlled current source for controlling a ratio of a HIGH-period and a LOW-period of the pulse-width-modulation signal.

7. The control circuit according to claim 1 wherein the control circuit is included in the switching power supply.

8. A method for controlling a switching power supply, which switches on and off a switching device therein with a pulse-width-modulation signal at an adjusted ON-period ratio for regulating an output voltage therefrom by a pulse-width-modulation method, the control method comprising the steps of:

comparing the output voltage from the switching power supply with a reference voltage for the output of an error signal;

generating a current corresponding to the error signal;

starting to generate the pulse-width-modulation signal at a predetermined cycle; and adjusting an ON-period, for which the pulse-width-modulation signal sets the switching device to be ON, by an electrifying and discharging voltage of a capacitor caused by the current corresponding to the error signal.

9. A control circuit for controlling a switching power supply, which switches a switching device therein on and off with a pulse-width-modulation signal at an adjusted OFF-period ratio for regulating an output voltage therefrom by a pulse-width-modulation method, the control circuit comprising:

an error amplifier circuit configured to compare the output voltage from the switching power supply with a reference voltage and output an error signal;

a pulse generator circuit configured to generate a pulse, the period thereof is fixed; and an OFF-period adjusting circuit configured to start generating the pulse-width-modulation signal in every cycle in response to the pulse outputted from the pulse generator circuit and adjust an OFF-period, for which the pulse-width-modulation signal sets the switching device to be OFF, the OFF-period adjusting circuit changing the OFF-period in response to an output voltage of the error signal outputted from the error amplifier circuit for outputting a desired pulse-width-modulation signal.

10. The control circuit according to claim 9, wherein the OFF-period adjusting circuit includes a voltage-controlled current source configured to be controlled by the output voltage of the error signal;

a capacitor, electrifiable by the voltage-controlled current source, configured to determine the OFF-period by electrification thereof;

a switch configured to change over the electrification and discharge of the capacitor; and a logic circuit configured to control whether the switch is ON or OFF.

11. The control circuit according to claim 10, wherein the OFF-period adjusting circuit sets a predetermined delay period after the pulse is outputted from the pulse generator, starts electrifying the capacitor after the predetermined delay period has elapsed, and causes the pulse-width-modulation signal to switch off the switching device in the switching power supply during the delay period.

12. The control circuit according to claim 10, wherein the OFF-period adjusting circuit sets a predetermined delay period after the pulse is outputted from the pulse generator, starts electrifying the capacitor after the predetermined delay period has elapsed, and causes the pulse-width-modulation signal to switch on the switching device in the switching power supply during the delay period.

13. The control circuit according to claim 9, wherein the OFF-period adjusting circuit includes a first voltage-controlled current source configured to be controlled by the output voltage of the error signal;

a second voltage-controlled current source configured to be controlled by the output voltage of the error signal;

a capacitor, electrifiable by the first voltage-controlled current source and dischargeable by the second voltage-controlled current source, configured to determine the OFF-period by electrification and discharge thereof;

a switch configured to change over the electrification and the discharge of the capacitor; and a logic circuit configured to control whether the switch is ON or OFF.

14. The control circuit according to claim 13, wherein
the OFF-period adjusting circuit fixes a changeover period ratio at which the electrification and the discharge of the capacitor are changed over; and the OFF-period adjusting circuit increases and decreases an average voltage of the capacitor in response to a change caused by the output voltage of the error signal and a difference between an electrifying current from the first voltage-controlled current source and a discharging current from the second voltage-controlled current source for controlling a ratio of a HIGH-period and a LOW-period of the pulse-width-modulation signal.

15. The control circuit according to claim 9 wherein the control circuit is included in the switching power supply.

16. A method for controlling a switching power supply, which switches a switching device therein on and off with a pulse-width-modulation signal at an adjusted OFF-period ratio for regulating an output voltage therefrom by a pulse-width-modulation method, the control method comprising the steps of:

comparing the output voltage from the switching power supply with a reference voltage to output an error signal;

generating a current corresponding to the error signal;

starting to generate the pulse-width-modulation signal at a predetermined cycle; and adjusting the OFF-period, for which the pulse-width-modulation signal sets the switching device to be OFF, by an electrifying and discharging voltage of a capacitor caused by the current corresponding to the error signal.

* * * * *